United States Patent
Ichinose et al.

(10) Patent No.: US 8,436,416 B2
(45) Date of Patent: May 7, 2013

(54) NONVOLATILE SEMICONDUCTOR MEMORY DEVICE AND METHOD FOR MANUFACTURING SAME

(75) Inventors: Daigo Ichinose, Mie-ken (JP); Tadashi Iguchi, Mie-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 372 days.

(21) Appl. No.: 12/839,784

(22) Filed: Jul. 20, 2010

(65) Prior Publication Data

US 2011/0115014 A1 May 19, 2011

(30) Foreign Application Priority Data

Nov. 19, 2009 (JP) ................. 2009-263830

(51) Int. Cl.
*H01L 27/115* (2006.01)
*H01L 21/8246* (2006.01)

(52) U.S. Cl.
USPC ............ 257/324; 257/E27.103; 257/E21.679; 438/264

(58) Field of Classification Search ................ 257/324, 257/326, E27.103, E21.679; 438/257, 258, 438/264
See application file for complete search history.

(56) References Cited

U.S. PATENT DOCUMENTS

2007/0252201 A1* 11/2007 Kito et al. .................. 257/331

FOREIGN PATENT DOCUMENTS

| JP | 2009-146954 | 7/2009 |
| KR | 10-2009-0047614 | 5/2009 |
| WO | WO2009075370 A1 * | 12/2007 |
| WO | WO 2009/075370 A1 | 6/2009 |

OTHER PUBLICATIONS

U.S. Appl. No. 13/423,464, filed Mar. 19, 2012, Ohsawa et al.
U.S. Appl. No. 12/728,763, filed Mar. 22, 2010, Nobutaka Watanabe.
U.S. Appl. No. 12/679,991, filed Mar. 25, 2010, Yoshiaki Fukuzumi, et al.
Office Action issued Aug. 18, 2011, in Korean Patent Application No. 10-2010-0085935 (with English-language translation).

* cited by examiner

*Primary Examiner* — Julio J Maldonado
*Assistant Examiner* — Daniel Shook
(74) *Attorney, Agent, or Firm* — Oblon, Spivak, McClelland, Maier & Neustadt, L.L.P.

(57) ABSTRACT

According to one embodiment, a nonvolatile semiconductor memory device includes a substrate, a stacked body, a plurality of semiconductor pillars and a charge storage film. The stacked body is provided on the substrate, with a plurality of insulating films alternately stacked with a plurality of electrode films, and includes a hydrophobic layer provided between one of the insulating films and one of the electrode films. The hydrophobic layer has higher hydrophobicity than the electrode films. The plurality of semiconductor pillars extend in a stacking direction of the stacked body and pierce the stacked body, and the charge storage film is provided between the electrode films and one of the semiconductor pillars.

21 Claims, 30 Drawing Sheets

US 8,436,416 B2

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2009-263830, filed on Nov. 19, 2009; the entire contents of which are incorporated herein by reference.

FIELD

Embodiments described herein relate generally to a nonvolatile semiconductor memory device and a method for manufacturing the same.

BACKGROUND

Conventionally, semiconductor memory devices such as flash memories have been fabricated by two-dimensionally integrating memory cells on the surface of a silicon substrate. In this type of semiconductor memory device, reduction of cost per bit and increase in memory capacity require increase in the packaging density of memory cells. However, recently, such increase in packaging density has been difficult in terms of cost and technology.

Methods of stacking memory cells for three-dimensional integration are known as techniques for breaking through the limit to increase in packaging density. However, in the method of simply stacking and processing layer by layer, increase in the number of stacked layers results in increasing the number of processes and increasing cost. In this context, the following technique is proposed. Electrode films made of silicon and insulating films made of silicon oxide are alternately stacked on a silicon substrate to form a stacked body. Then, through hole are formed in this stacked body by collective processing. A block insulating film, a charge storage film, and a tunnel insulating film are deposited in this order on the side surface of the through hole. Furthermore, a silicon pillar is buried inside the through hole (for instance, refer to JP-A 2009-146954 (Kokai)).

In this collectively processed three-dimensional stacked memory, a memory cell transistor is formed at each intersection between the electrode film and the silicon pillar, and information can be stored by controlling the potential of each electrode film and each silicon pillar to transfer charge between the silicon pillar and the charge storage film. In this technique, through holes are formed by collectively processing the stacked body. Hence, increase in the number of stacked electrode films does not result in increasing the number of lithography processes, and cost increase can be suppressed.

However, in such a collectively processed three-dimensional stacked memory, it is difficult to form memory cell transistors with the characteristics being uniform throughout the stacked body. For instance, when a through hole is formed in the stacked body, it is extremely difficult to process completely vertically the side surface of the portion piercing the insulating film, and a certain taper angle inevitably occurs. In particular, it is difficult to process a silicon oxide film. Hence, the through hole is narrower in the lower portion of the stacked body than in the upper portion. This causes variation in the characteristics of memory cell transistors.

BRIEF DESCRIPTION OF THE DRAWINGS

FIG. 1A shows an end portion of the memory array region, FIG. 1B shows the center portion of the memory array region, and FIG. 1C shows the peripheral circuit region;

DETAILED DESCRIPTION

In general, according to one embodiment, a nonvolatile semiconductor memory device includes a substrate, a stacked body, a plurality of semiconductor pillars and a charge storage film. The stacked body is provided on the substrate, with a plurality of insulating films alternately stacked with a plurality of electrode films, and includes a hydrophobic layer provided between one of the insulating films and one of the electrode films. The hydrophobic layer has higher hydrophobicity than the electrode films. The plurality of semiconductor pillars extend in a stacking direction of the stacked body and pierce the stacked body, and the charge storage film is provided between the electrode films and one of the semiconductor pillars.

Embodiments of the invention will now be described with reference to the drawings.

At the outset, a first embodiment is described.

Figures 1A, 1B, 1C:
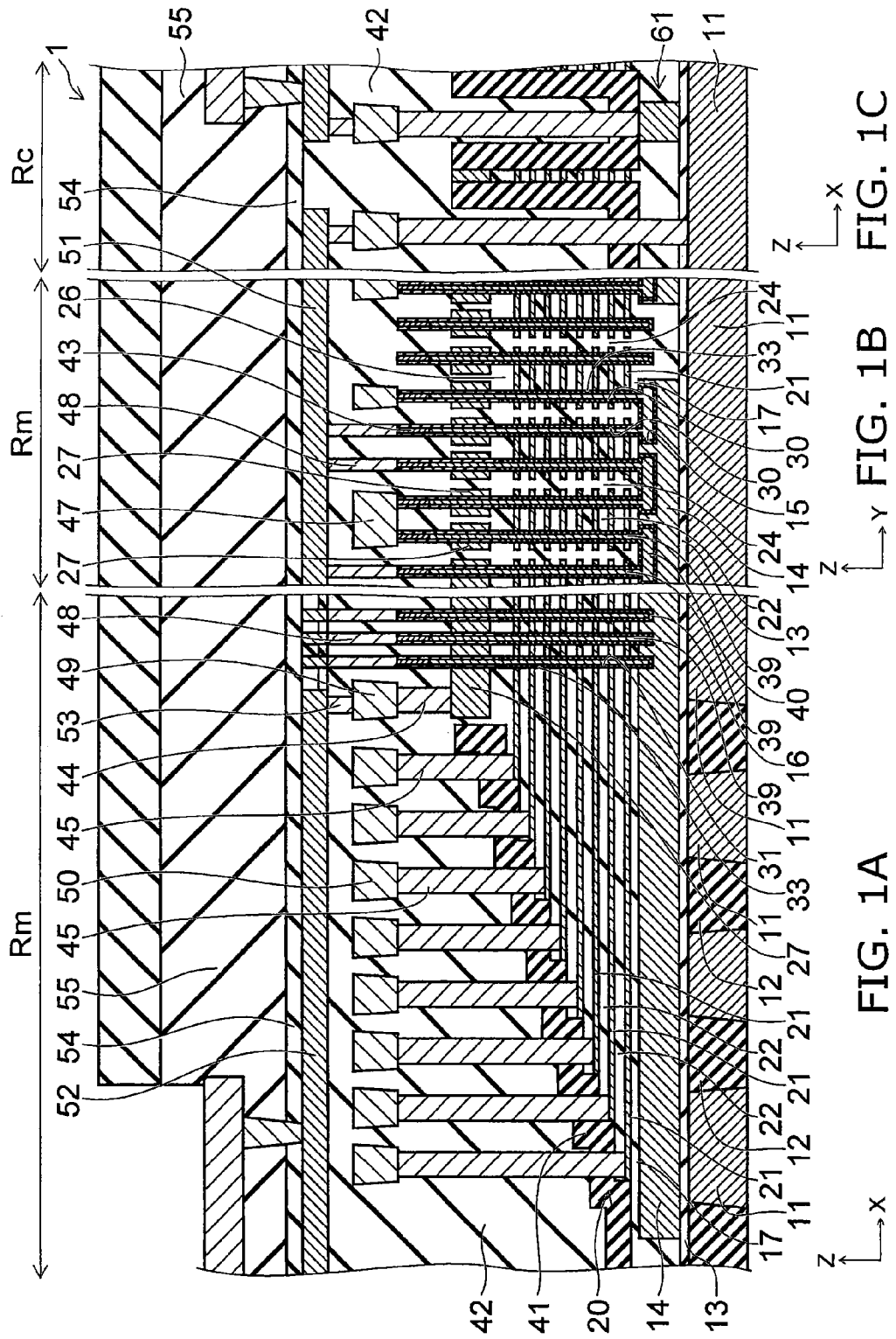
FIGS. 1A to 1C are cross-sectional views illustrating a nonvolatile semiconductor memory device according to a first embodiment, where

FIGS. 1A to 1C are sectional views illustrating a nonvolatile semiconductor memory device according to this embodiment, where FIG. 1A shows an end portion of the memory array region, FIG. 1B shows the center portion of the memory array region, and FIG. 1C shows the peripheral circuit region.

Figure 2:
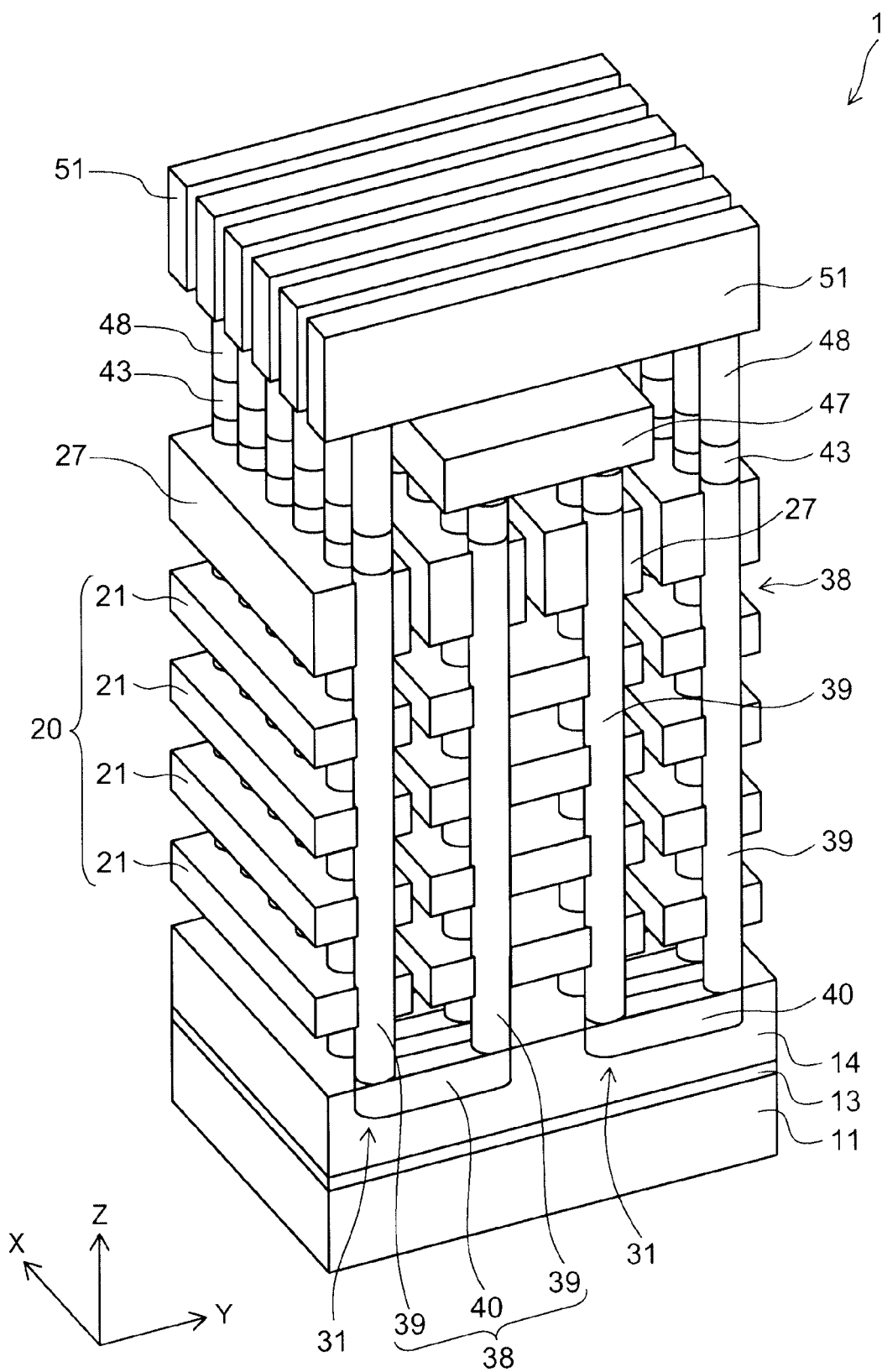
FIG. 2 is a perspective view illustrating the center portion of the memory array region in the nonvolatile semiconductor memory device according to the first embodiment.

FIG. 2 is a perspective view illustrating the center portion of the memory array region in the nonvolatile semiconductor memory device according to this embodiment.

Figure 3:
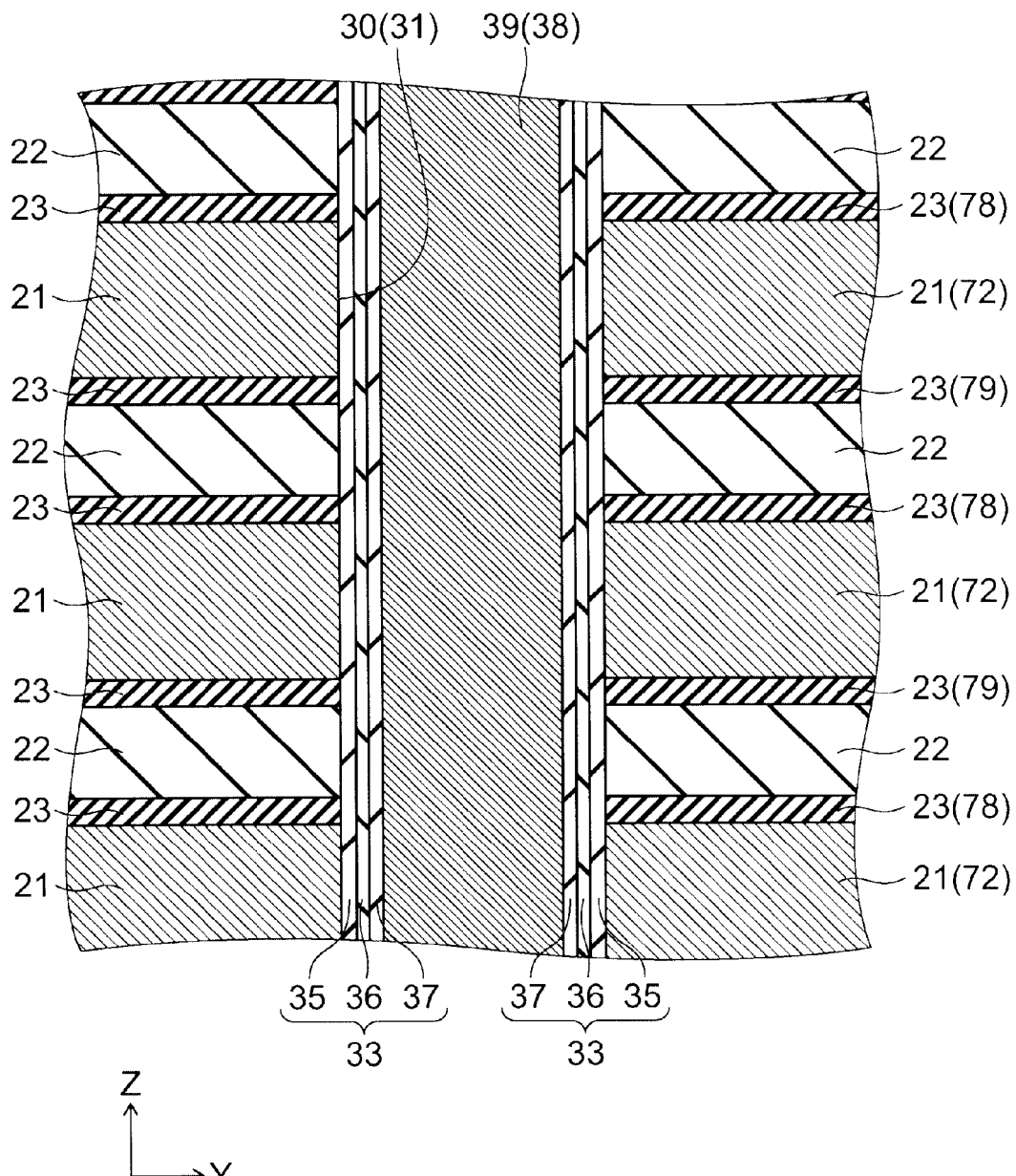
FIG. 3 is a partially enlarged sectional view illustrating the periphery of a silicon pillar in the nonvolatile semiconductor memory device according to the first embodiment.

FIG. 3 is a partially enlarged sectional view illustrating the periphery of a silicon pillar in the nonvolatile semiconductor memory device according to this embodiment.

It is noted that in FIG. 2, for convenience of illustration, only the conductive portions are shown in principle, and illustration of the insulating portions is omitted.

First, the characteristic portion of this embodiment is outlined.

The nonvolatile semiconductor memory device according to this embodiment is a three-dimensionally stacked memory device in which a plurality of insulating films and electrode films are stacked on a silicon substrate to form a stacked body, through holes are formed in this stacked body, a vertically extending silicon pillar is buried in the through hole, and a tunnel insulating film, a charge storage film, and a block insulating film are provided around the silicon pillar, characterized in that a hydrophobic layer having higher hydrophobicity than the electrode film is provided between the insulating film and the electrode film.

The manufacturing method according to this embodiment is characterized as follows. A stacked body is formed on a silicon substrate by sequentially repeating the processes of depositing a boron-doped silicon layer, forming a silicon nitride layer on the surface thereof, depositing a non-doped silicon layer, and forming a silicon nitride layer on the surface thereof. Then, through holes are formed in this stacked body, and a sacrificial material is buried in the through hole. Furthermore, a slit is formed in the stacked body, an aqueous etching solution is introduced into the slit to remove the non-doped silicon layer, and then the aqueous etching solution is dried. Next, silicon oxide is buried in the space from which the non-doped silicon layer has been removed and in the slit. Next, the sacrificial material is removed from inside the through hole, a charge storage film is formed on the inner surface of the through hole, and a silicon pillar is buried inside. Thus, a nonvolatile semiconductor memory device is manufactured.

Here, in the stacked body, the silicon nitride layer is interposed between the boron-doped silicon layer and the non-doped silicon layer. This can prevent diffusion of boron from the boron-doped silicon layer into the non-doped silicon layer by heat at the time of depositing the non-doped silicon layer. Thus, variation in the thickness and boron concentration of the boron-doped silicon layer can be suppressed. Furthermore, because no silicon oxide film exists in the stacked body at the time of forming the through holes, the through holes can be formed nearly vertically. Moreover, the silicon nitride layer, which is exposed by wet etching of the non-doped silicon layer, has higher hydrophobicity than the boron-doped silicon layer, and hence is less affected by the surface tension of the aqueous etching solution when it is dried. This can prevent deformation of the boron-doped silicon layer.

In the following, the configuration of the nonvolatile semiconductor memory device according to this embodiment is described in detail.

As shown in FIGS. 1A to 1C, the nonvolatile semiconductor memory device 1 (hereinafter also simply referred to as "device 1") according to this embodiment includes a silicon substrate 11. STI (shallow trench isolation) 12 is selectively formed in the upper portion of the silicon substrate 11. Furthermore, the device 1 includes a memory array region Rm and a peripheral circuit region Rc.

In the following, for convenience of description, an XYZ orthogonal coordinate system is introduced in the specification. In this coordinate system, the two directions parallel to the upper surface of the silicon substrate 11 and orthogonal to each other are referred to as X and Y direction, and the direction orthogonal to both the X and Y direction, or the stacking direction of the layers, is referred to as Z direction.

First, the memory array region Rm is described.

As shown in FIGS. 1A to 1C and 2, in the memory array region Rm, a silicon oxide film 13 is formed on the silicon substrate 11, and a back gate electrode 14 made of a conductive material, such as silicon doped with boron (boron-doped silicon) is provided thereon. A plurality of recesses 15 each shaped like a rectangular solid extending in the Y direction are formed in the upper portion of the back gate electrode 14, and a thin thermal oxide film (not shown) is formed on the inner surface of the recess 15. Furthermore, a silicon oxide film 17 is provided on the back gate electrode 14.

A stacked body 20 is provided on the silicon oxide film 17. The stacked body 20 includes a plurality of electrode films 21. The electrode films 21 are made of boron-doped silicon, shaped like strips extending in the X direction, and arranged in a matrix along the Y and Z direction. Furthermore, the end portion of the stacked body 20 is processed into a staircase pattern in which the electrode films 21 arranged in the Z direction each constitute a step thereof.

As shown in FIG. 3, an insulating film 22 is provided between the electrode films 21 adjacent in the Z direction. That is, a plurality of electrode films 21 and insulating films 22 are alternately stacked in the stacked body 20. The insulating film 22 is illustratively formed from silicon oxide. A hydrophobic layer 23 is provided between the electrode film 21 and the insulating film 22. The hydrophobic layer 23 is a layer having higher hydrophobicity than the electrode film 21, and is illustratively formed from silicon nitride.

Furthermore, as shown in FIGS. 1A to 1C, an insulating plate 24 illustratively made of silicon oxide is provided between the electrode films 21 adjacent in the Y direction. The insulating plate 24 is shaped like a plate extending in the X and Z direction and pierces the stacked body 20. Thus, the insulating plates 24 divide the electrode film 21 into a plurality of portions extending in a direction (X direction) parallel to each other.

A silicon oxide film 26 is provided on the stacked body 20, and a plurality of control electrodes 27 made of boron-doped silicon and extending in the X direction are provided thereon. Furthermore, a plurality of through holes 30 extending in the Z direction are formed in the stacked body 20, the silicon oxide film 26, and the control electrodes 27. The through holes 30 are arranged in a matrix along the X and Y direction and pierce the control electrode 27, the silicon oxide film 26, and the stacked body 20 to both end portions in the Y direction of the recess 15. Thus, a pair of through holes 30 adjacent in the Y direction are caused to communicate with each other by the recess 15, constituting one U-hole 31. Each through hole 30 is illustratively shaped like a cylinder, and each U-hole 31 is nearly U-shaped. The diameter of the through hole 30 is nearly uniform over the entire length, and hence the diameter of the upper end portion of the through hole 30 is nearly equal to the diameter of the lower end portion. Furthermore, each electrode film 21 is pierced by two sequences of through holes 30 arranged along the X direction. The arrangement of the recesses 15 and the arrangement of the electrode films 21 in the Y direction have an equal arrangement pitch, but are out of phase by half the pitch. Hence, each of the two sequences of through holes 30 piercing the electrode films 21 belongs to a different one of the U-holes 31.

As shown in FIG. 3, a block insulating film 35 is provided on the inner surface of the U-hole 31. The block insulating film 35 is a film which passes no substantial current even if a voltage within the driving voltage range of the device 1 is applied. The block insulating film 35 is formed from a high dielectric material, such as silicon oxide, which is illustratively formed from a material having higher dielectric constant than the material forming the charge storage film 36 described below. A charge storage film 36 is provided on the block insulating film 35. The charge storage film 36 is a film capable of storing charge, such as a silicon nitride film, which is illustratively a film containing electron trap sites. A tunnel insulating film 37 is provided on the charge storage film 36. The tunnel insulating film 37 is a film which is normally insulative, but passes a tunneling current when a prescribed voltage within the driving voltage range of the device 1 is applied. The tunnel insulating film 37 is illustratively formed from silicon oxide. The block insulating film 35, the charge storage film 36, and the tunnel insulating film 37 are stacked into a memory film 33.

As shown in FIGS. 1A to 1C and 3, polysilicon doped with impurity, such as phosphorus, is buried in the U-hole 31 to form a U-pillar 38. The U-pillar 38 is U-shaped, reflecting the shape of the U-hole 31. The U-pillar 38 is in contact with the tunnel insulating film 37. In the U-pillar 38, the portion located in the through hole 30 constitutes a silicon pillar 39, and the portion located in the recess 15 constitutes a connecting member 40. Thus, the aforementioned charge storage film 36 is located between the electrode film 21 and the silicon pillar 39. The silicon pillar 39 is shaped like a cylinder reflecting the shape of the through hole 30, and the connecting member 40 is shaped like a rectangular solid reflecting the shape of the recess 15. The diameter of the silicon pillar 39 is nearly uniform over the entire length, and the diameter of the upper end portion is nearly equal to the diameter of the lower end portion. Here, the U-hole 31 may be completely filled with polysilicon to form a columnar U-pillar 38, or may be filled with a void left along the central axis to form a pipe-shaped U-pillar 38.

Furthermore, as shown in FIGS. 1A to 1C and 2, a silicon nitride film 41 is provided on the side surface of the stacked body 20 processed into a staircase pattern, on the side surface of the silicon oxide film 26, and on the side surface of the control electrode 27. The silicon nitride film 41 is formed in a staircase pattern, reflecting the shape of the end portion of the stacked body 20. Furthermore, an interlayer insulating film 42 illustratively made of silicon oxide is provided on the control electrode 27 and on the silicon nitride film 41 to bury the stacked body 20.

Plugs 43 and contacts 44 and 45 are buried in the interlayer insulating film 42. The plug 43 is located immediately above the silicon pillar 39 and connected to the silicon pillar 39. The contact 44 is located immediately above one end portion in the X direction of the control electrode 27 and connected to the control electrode 27. The contact 45 is located immediately above one end portion in the X direction of the electrode film 21 and connected to the electrode film 21.

Source lines 47, plugs 48, and wirings 49 and 50 are buried in the portion of the interlayer insulating film 42 above the plugs 43 and the contacts 44 and 45. The source line 47 extends in the X direction and is connected through the plug 43 to one of a pair of silicon pillars 39 belonging to the U-pillar 38. The plug 48 is connected through the plug 43 to the other of the pair of silicon pillars 39 belonging to the U-pillar 38. The wirings 49 and 50 extend in the Y direction and are connected to the contacts 44 and 45, respectively.

A bit line 51 extending in the Y direction is provided on the interlayer insulating film 42 and connected to the plug 48. Furthermore, a wiring 52 is provided on the interlayer insulating film 42 and connected to the wiring 49 through a plug 53. A silicon nitride film 54 and an interlayer insulating film 55 are provided on the interlayer insulating film 42 so as to bury the bit line 51 and the wiring 52, and prescribed wirings and the like are buried therein.

On the other hand, as shown in FIG. 1C, in the peripheral circuit region Rc, transistors 61 and the like are formed in the upper portion of the silicon substrate 11. The interlayer insulating film 42, the silicon nitride film 54, and the interlayer insulating film 55 are provided on the silicon substrate 11, and prescribed wirings and the like are buried therein. Here, although the horizontal axis in FIG. 1C is directed in the X direction, it may be directed in the Y direction.

In the device 1, a memory cell transistor of the MONOS (metal-oxide-nitride-oxide-silicon) type is formed at the intersection between the electrode film 21 and the silicon pillar 39, and a select transistor is formed at the intersection between the control electrode 27 and the silicon pillar 39. This results in a memory string in which a plurality of memory cell transistors are series connected between the bit line 51 and the source line 47, and the select transistors are connected to both sides thereof.

Next, a method for manufacturing a nonvolatile semiconductor memory device according to this embodiment is described.

FIGS. 4A to 17B illustrate the method for manufacturing a nonvolatile semiconductor memory device according to this embodiment, where each figure with the suffix A is a process plan view, and each figure with the suffix B is a process sectional view taken along line A-A' shown in the corresponding figure with the suffix A.

Here, FIGS. 4A to 17B show the memory array region Rm of the device 1.

First, as shown in FIGS. 1A to 1C, a silicon substrate 11 is prepared. Then, STI 12 is selectively formed in the upper portion of the silicon substrate 11. Next, transistors 61 are formed in the peripheral circuit region Rc. Furthermore, a silicon oxide film 13 is formed on the upper surface of the silicon substrate 11 in the memory array region Rm.

Figure 4A:
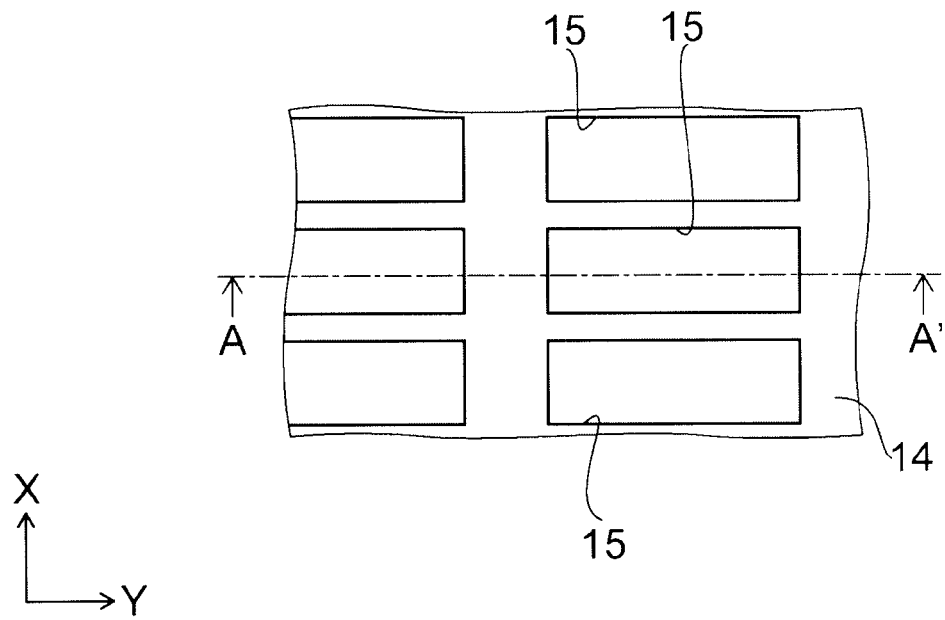
FIG. 4A is a process plan view illustrating a method for manufacturing a nonvolatile semiconductor memory device according to the first embodiment.
Figure 4B:
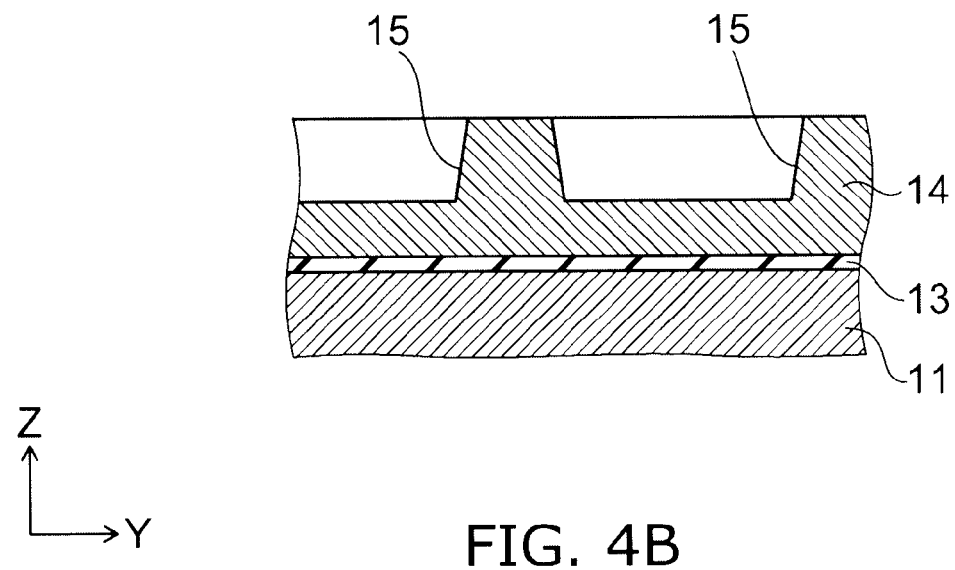
FIG. 4B is a process cross-sectional view taken along line A-A' shown in FIG. 4A.

Next, as shown in FIGS. 4A and 4B, in the memory array region Rm, a film made of boron-doped polysilicon is formed and patterned into a back gate electrode 14. Next, a photolithography process is used to form a recess 15 shaped like a rectangular solid with the longitudinal direction along the Y direction in the upper surface of the back gate electrode 14. The recesses 15 are formed in a plurality of regions so as to be arranged in a matrix along the X and Y direction.

Figure 5A:
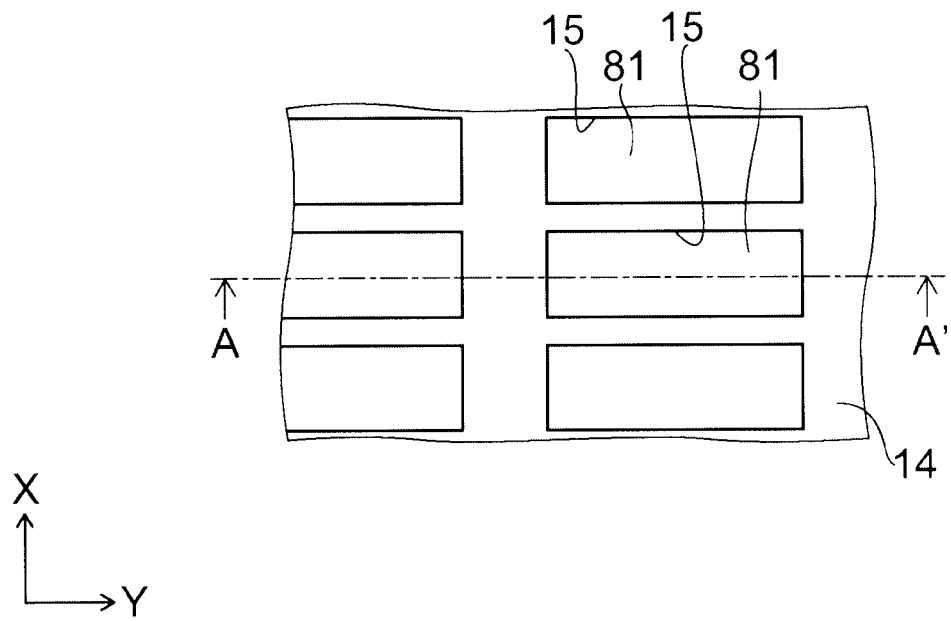
FIG. 5A is a process plan view illustrating a method for manufacturing a nonvolatile semiconductor memory device according to the first embodiment.
Figure 5B:
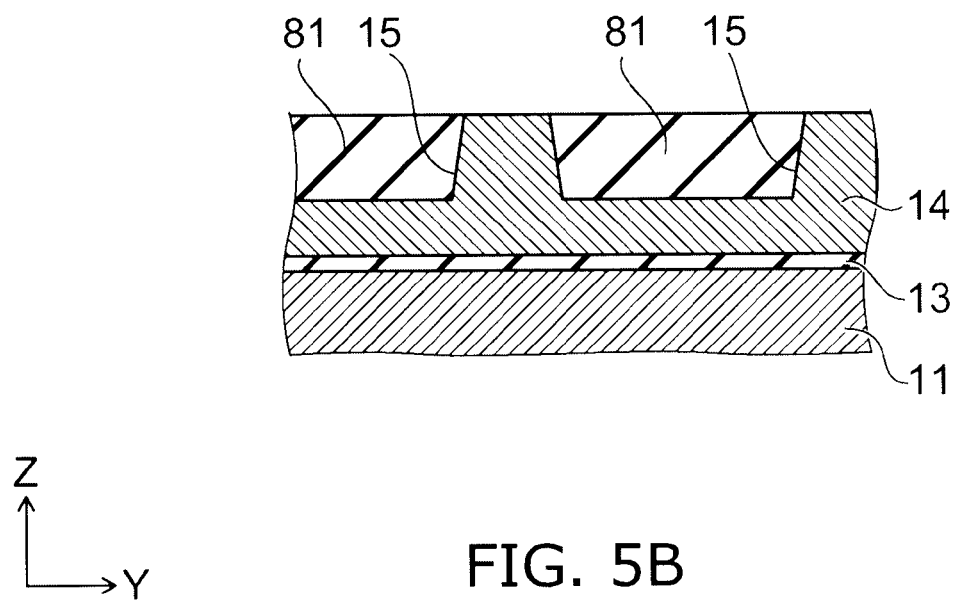
FIG. 5B is a process cross-sectional view taken along line A-A' shown in FIG. 5A.

Next, as shown in FIGS. 5A and 5B, a thin thermal oxide film (not shown) is formed on the surface of the back gate electrode 14. Then, silicon nitride is deposited on the entire surface, and then etching is performed on the entire surface. Thus, the silicon nitride is removed from above the upper surface of the back gate electrode 14 to expose the region of the upper surface of the back gate electrode 14 between the recesses 15, and a sacrificial material 81 made of silicon nitride is buried in the recess 15.

Figure 6A:
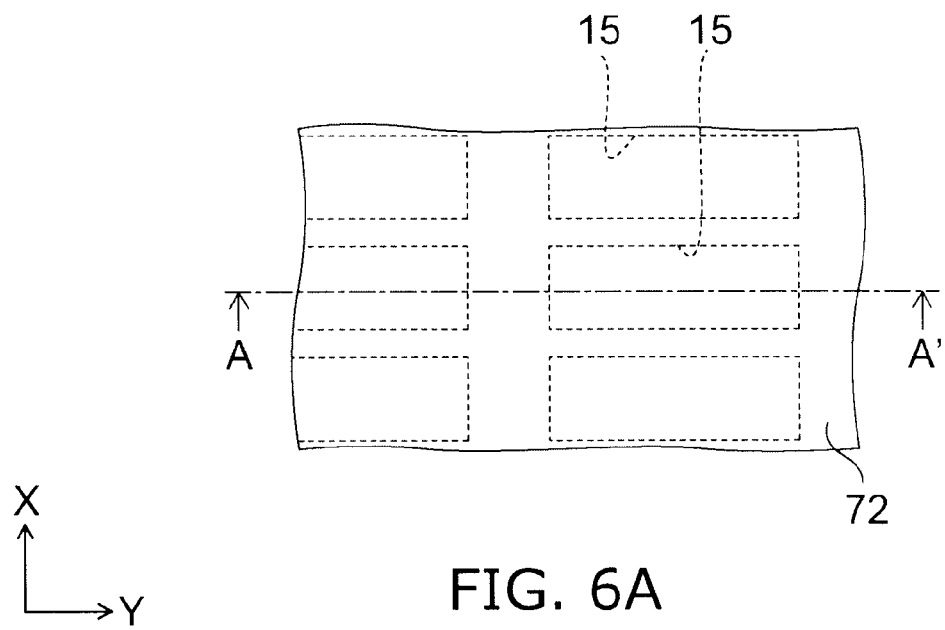
FIG. 6A is a process plan view illustrating a method for manufacturing a nonvolatile semiconductor memory device according to the first embodiment.
Figure 6B:
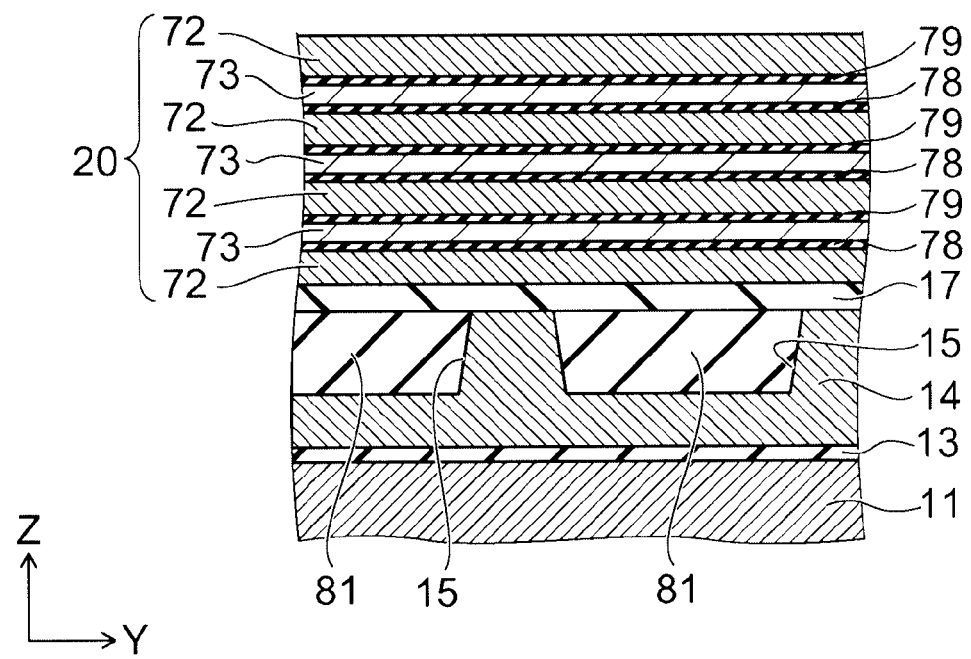
FIG. 6B is a process cross-sectional view taken along line A-A' shown in FIG. 6A.

Next, as shown in FIGS. 6A and 6B, a silicon oxide film 17 is formed entirely on the back gate electrode 14 and the sacrificial material 81. The film thickness of the silicon oxide film 17 is such that a required breakdown voltage can be ensured between the back gate electrode 14 and the lowermost electrode film 21 of the electrode films 21 which are to be formed on the silicon oxide film 17 in a later process.

Next, a boron-doped silicon layer 72 is formed by depositing boron-doped silicon illustratively using a CVD (chemical vapor deposition) process at a temperature of 420° C. Next, nitridation treatment is performed illustratively by heating to a temperature of 900° C. in a nitrogen atmosphere to form a silicon nitride layer 78 on the upper surface of the boron-doped silicon layer 72. Next, a non-doped silicon layer 73 is formed by depositing non-doped silicon illustratively using a CVD process at a temperature of 525° C. Next, the aforementioned nitridation treatment is performed to form a silicon nitride layer 79 on the upper surface of the non-doped silicon layer 73. Here, the thickness of the boron-doped silicon layer 72 is such that the function as a gate electrode of the device 1 can be achieved, and is illustratively 50 nm. The thickness of the non-doped silicon layer 73 corresponds to the thickness of an insulating layer which can ensure a required breakdown voltage between the gate electrodes, and is illustratively 35 nm. Furthermore, the thickness of each of the silicon nitride layers 78 and 79 is illustratively 1 to 2 nm.

Subsequently, in a similar manner, formation of a boron-doped silicon layer 72, formation of a silicon nitride layer 78, formation of a non-doped silicon layer 73, and formation of a silicon nitride layer 79 are repeated to form a stacked body 20. The uppermost layer of the stacked body 20 is the boron-doped silicon layer 72, and there is no need to form a silicon nitride layer 78 on the upper surface of this uppermost boron-doped silicon layer 72. Here, the silicon nitride layers 78 and 79 block diffusion of boron, and can prevent boron in the boron-doped silicon layer 72 from diffusing into the non-doped silicon layer 73 by heat in the CVD process. Furthermore, the silicon nitride layers 78 and 79 are hydrophobic layers having higher hydrophobicity than the boron-doped silicon layer 72. It is noted that although four boron-doped silicon layers 72 are illustratively stacked in this embodiment, the number of stacked layers is not limited to four.

Figure 7A:
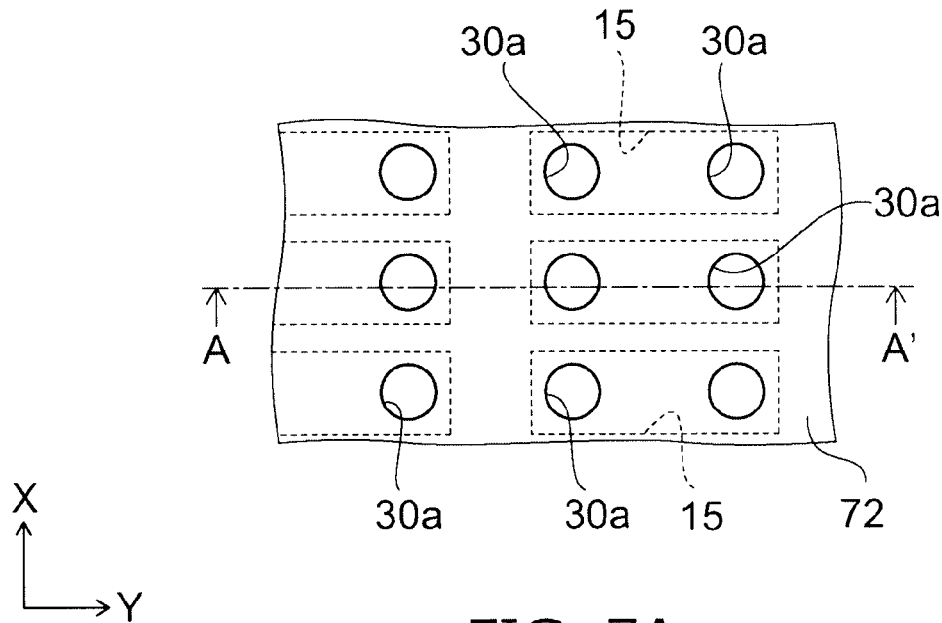
FIG. 7A is a process plan view illustrating a method for manufacturing a nonvolatile semiconductor memory device according to the first embodiment.
Figure 7B:
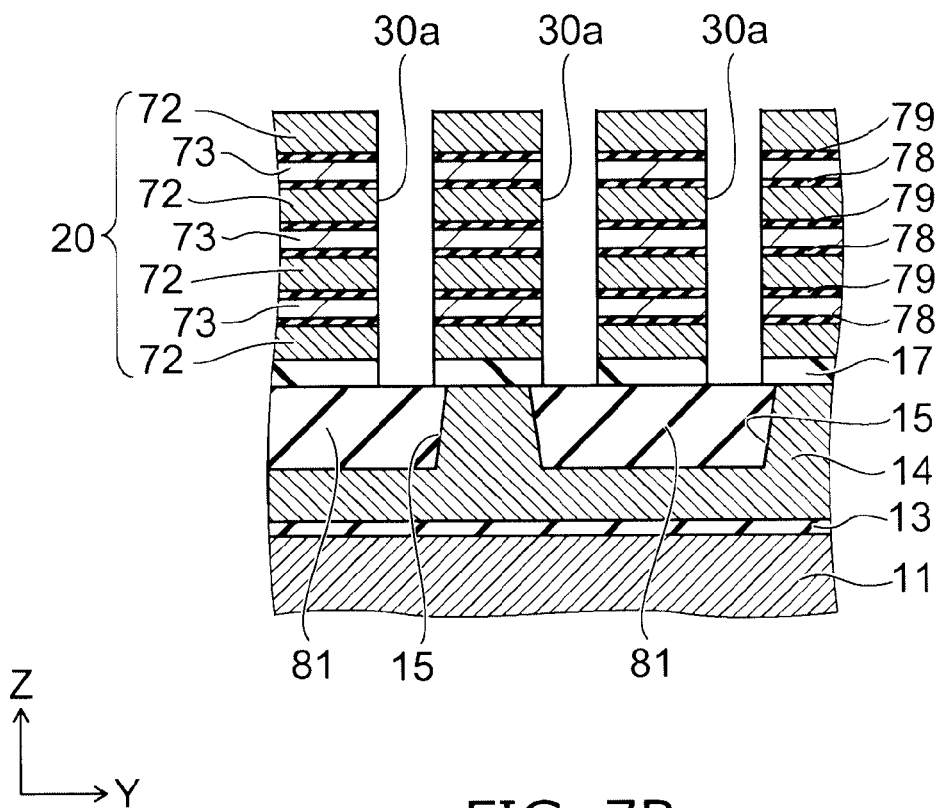
FIG. 7B is a process cross-sectional view taken along line A-A' shown in FIG. 7A.

Next, as shown in FIGS. 7A and 7B, by photolithography and etching, through holes 30a extending in the Z direction are formed in the stacked body 20 from its upper surface side so as to pierce the stacked body 20. The through holes 30a are collectively formed by dry etching, each shaped like a circle as viewed in the Z direction. Furthermore, the through holes 30a are arranged in a matrix along the X and Y direction so that a pair of through holes 30a adjacent in the Y direction reach both end portions in the Y direction of the recess 15.

Figure 8A:
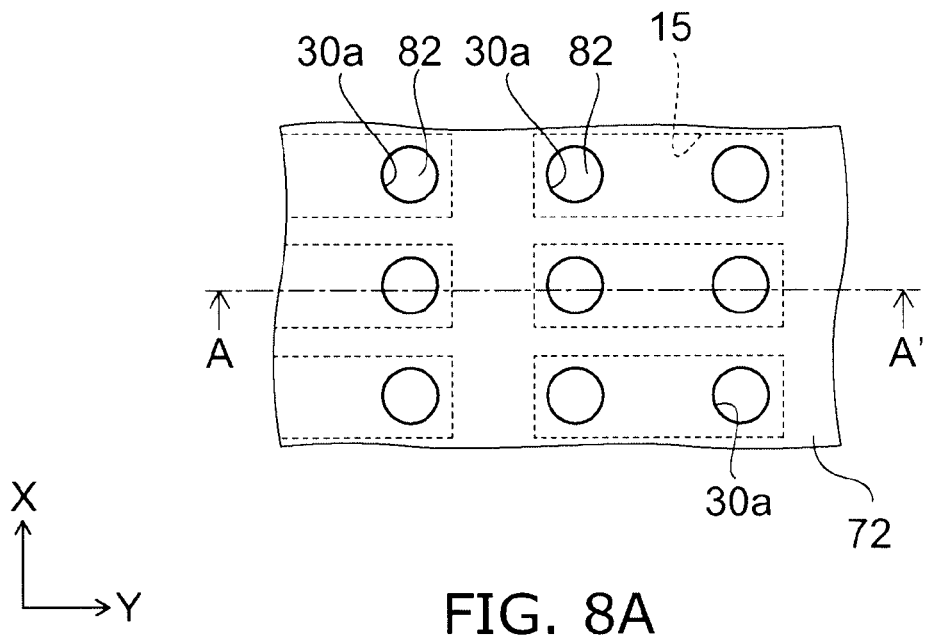
FIG. 8A is a process plan view illustrating a method for manufacturing a nonvolatile semiconductor memory device according to the first embodiment.
Figure 8B:
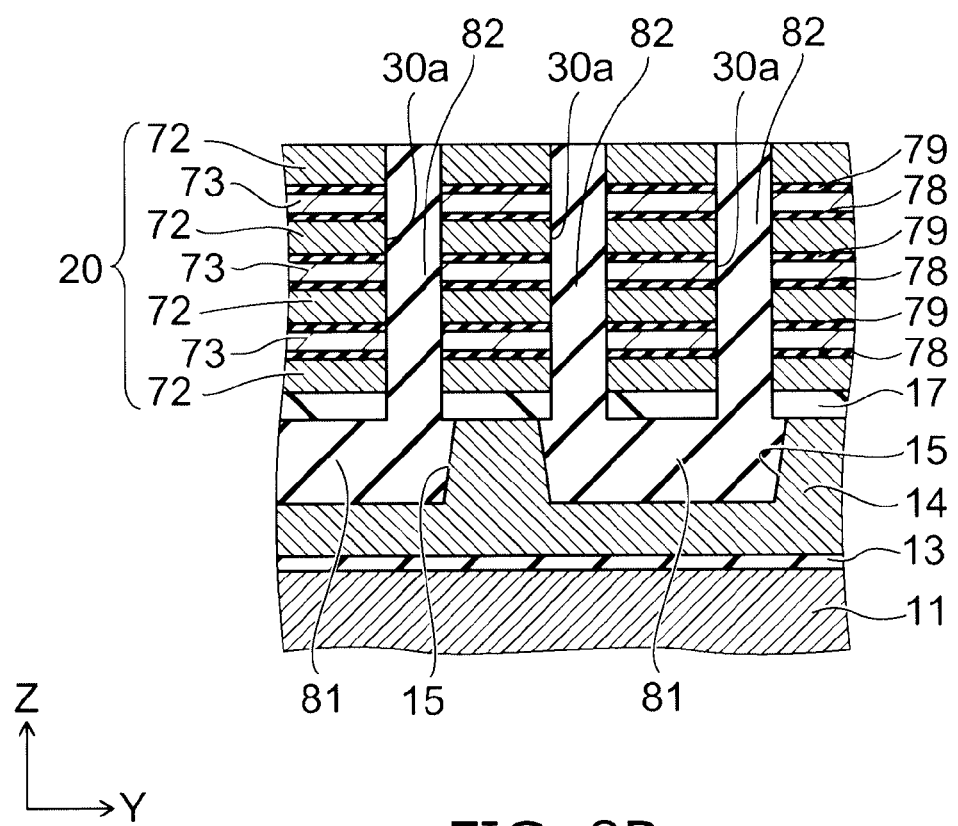
FIG. 8B is a process cross-sectional view taken along line A-A' shown in FIG. 8A.

Next, as shown in FIGS. 8A and 8B, silicon nitride is deposited on the entire surface, and then etching is performed on the entire surface to remove the silicon nitride deposited on the upper surface of the stacked body 20. Thus, a sacrificial material 82 made of silicon nitride is buried in the through hole 30a, and the uppermost boron-doped silicon layer 72 is exposed.

Figure 9A:
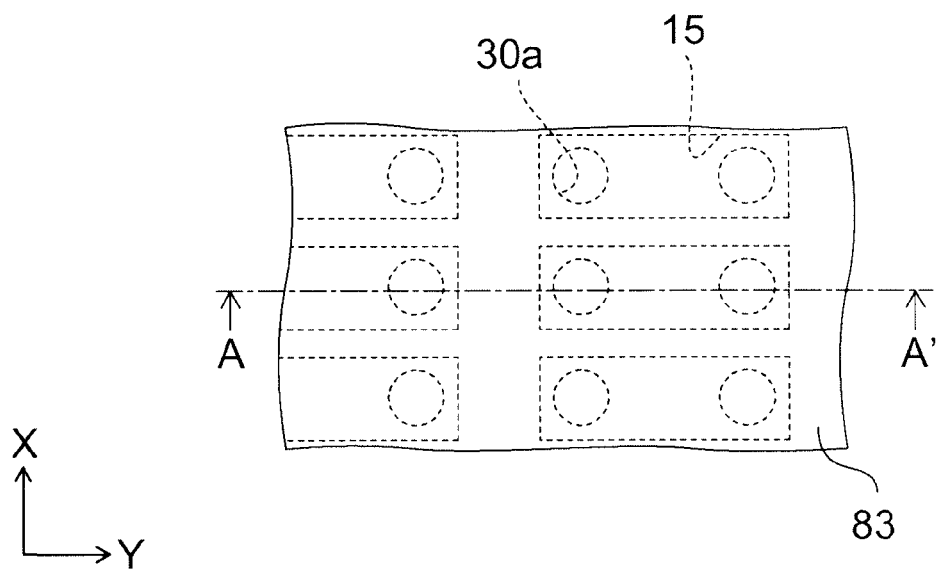
FIG. 9A is a process plan view illustrating a method for manufacturing a nonvolatile semiconductor memory device according to the first embodiment.
Figure 9B:
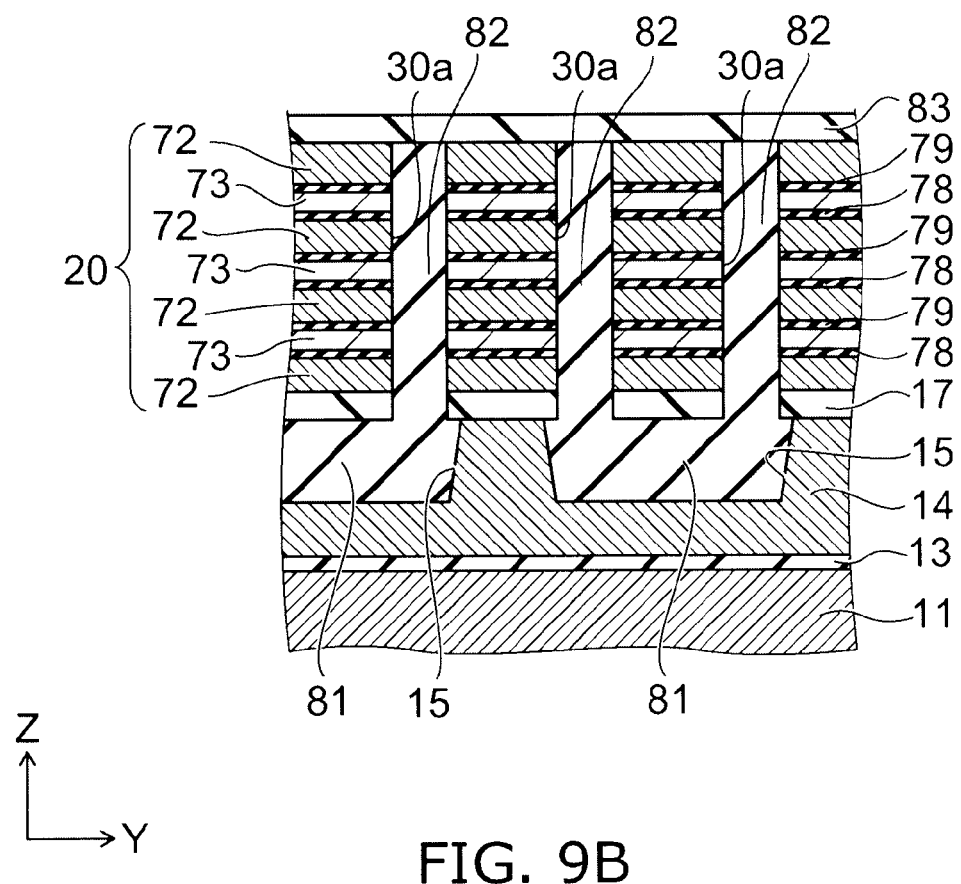
FIG. 9B is a process cross-sectional view taken along line A-A' shown in FIG. 9A.

Next, as shown in FIGS. 9A and 9B, a silicon oxide film 83 for protecting the uppermost boron-doped silicon layer 72 is formed on the stacked body 20.

Figure 10A:
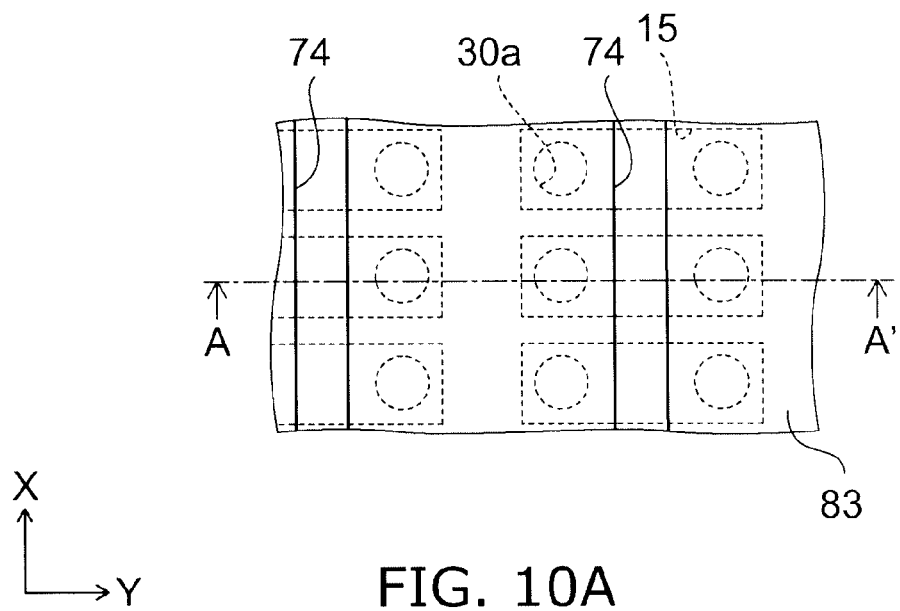
FIG. 10A is a process plan view illustrating a method for manufacturing a nonvolatile semiconductor memory device according to the first embodiment.
Figure 10B:
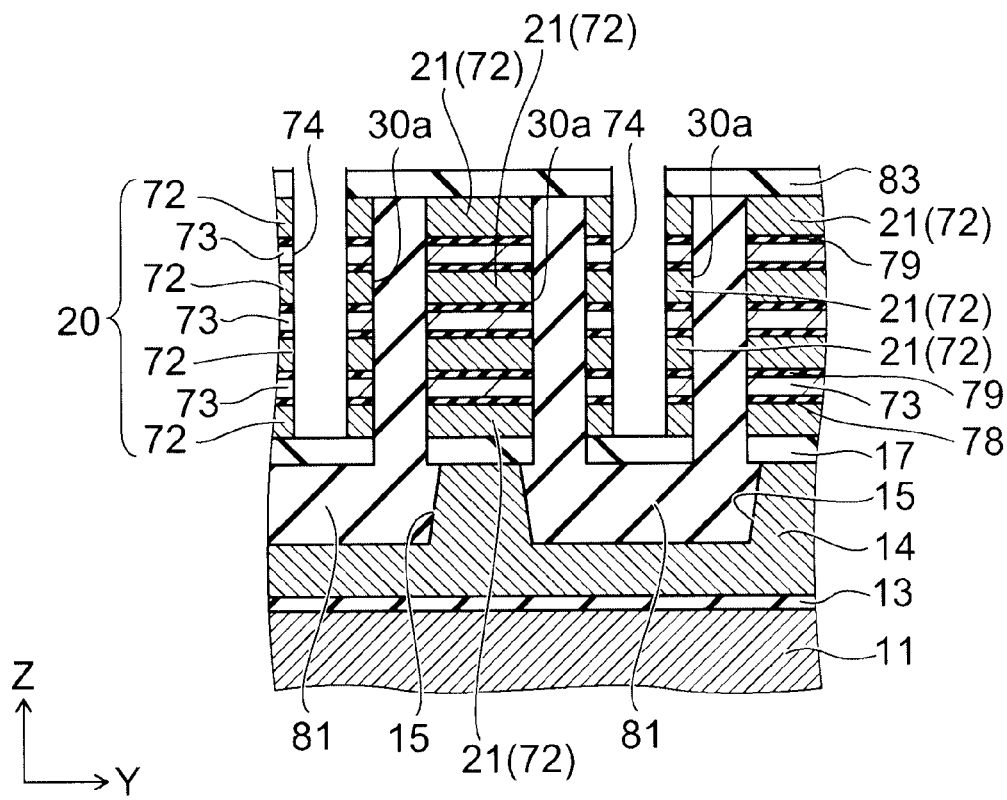
FIG. 10B is a process cross-sectional view taken along line A-A' shown in FIG. 10A.

Next, as shown in FIGS. 10A and 10B, a plurality of slits 74 are formed in the silicon oxide film 83 and the stacked body 20 from the upper surface side. Each slit 74 is formed so as to extend in the X direction through immediately above the center portion in the Y direction of the recess 15, to pierce the silicon oxide film 83 and the stacked body 20 in the Z direction, and not to pierce the silicon oxide film 17. Thus, the boron-doped silicon layer 72 is divided into a plurality of portions extending in the X direction. This portion constitutes an electrode film 21.

Figure 11A:
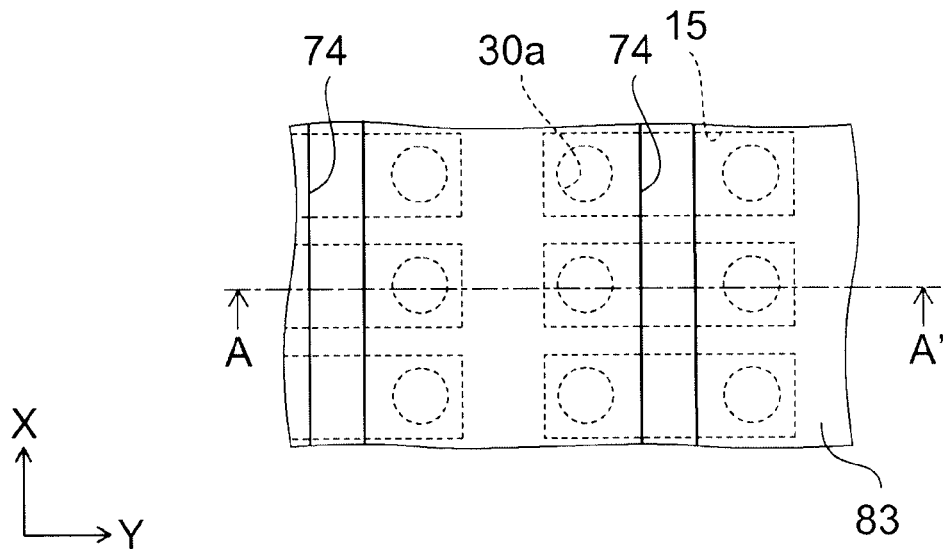
FIG. 11A is a process plan view illustrating a method for manufacturing a nonvolatile semiconductor memory device according to the first embodiment.
Figure 11B:
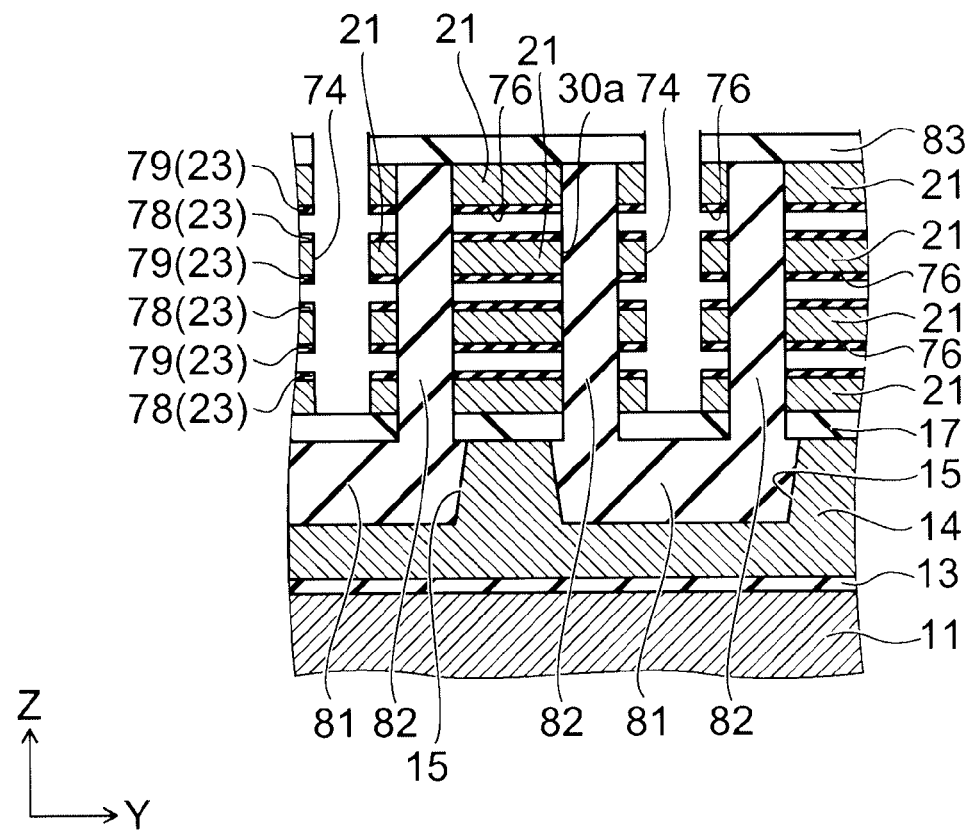
FIG. 11B is a process cross-sectional view taken along line A-A' shown in FIG. 11A.

Next, as shown in FIGS. 11A and 11B, wet etching is performed through the slit 74. This wet etching is performed using an aqueous etching solution, such as an alkaline aqueous etching solution. Here, high etching selection ratio can be achieved between boron-doped silicon and non-doped silicon by suitably selecting the aqueous etching solution. Thus, the non-doped silicon layer 73 (see FIG. 10B) can be removed while leaving the electrode film 21 made of the boron-doped silicon layer 72. A gap 76 is formed in the space from which the non-doped silicon layer 73 has been removed, that is, in the space between the electrode films 21 in the Z direction. Here, the electrode films 21 are supported by the cylindrical sacrificial material 82.

Next, the stacked body 20 is dried. Thus, the aqueous etching solution is removed also from inside the gap 76. Here, with the removal of the aqueous etching solution from inside the gap 76, the state of surface tension of the aqueous etching solution changes, and this change affects the internal structure of the stacked body 20. If this effect is significant, the electrode films 21 may be deformed, bent, or brought into contact with each other. Furthermore, the cylindrical sacrificial material 82 may collapse by being dragged by the bent electrode film 21. In general, the effect of surface tension of water exerted on a solid in contact therewith increases as the hydrophilicity of the solid surface becomes higher, and decreases as its hydrophobicity becomes higher. In this embodiment, the boron-doped silicon layer 72 is covered with the silicon nitride layers 78 and 79 having higher hydrophobicity than it, and the silicon nitride layers 78 and 79 function as hydrophobic layers 23, thus decreasing the effect of surface tension of the aqueous etching solution exerted on the boron-doped silicon layer 72. Hence, the deformation and the like of the electrode film 21 associated with drying of the aqueous etching solution can be prevented.

Figure 12A:
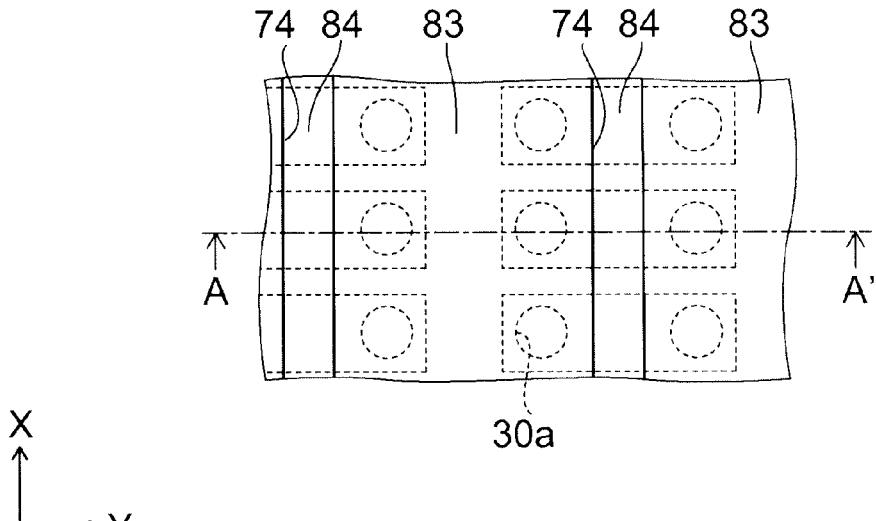
FIG. 12A is a process plan view illustrating a method for manufacturing a nonvolatile semiconductor memory device according to the first embodiment.
Figure 12B:
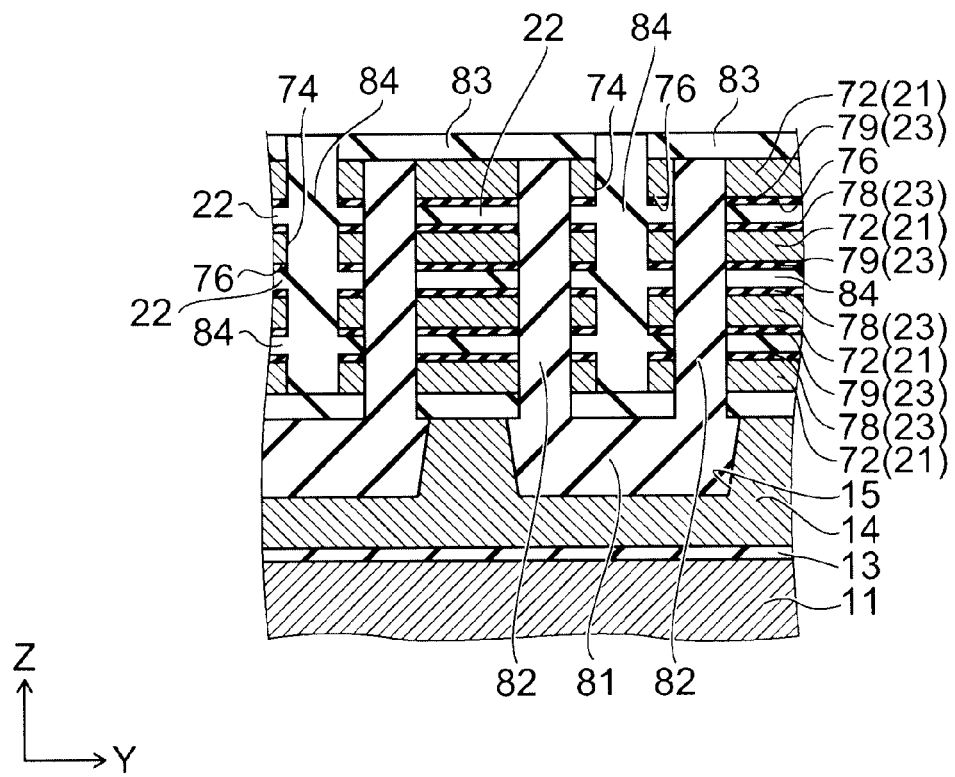
FIG. 12B is a process cross-sectional view taken along line A-A' shown in FIG. 12A.

Next, as shown in FIGS. 12A and 12B, silicon oxide is deposited on the entire surface illustratively by an ALD (atomic layer deposition) process. Thus, silicon oxide 84 is buried in the gap 76 and in the slit 74. Thus, an insulating film 22 is formed in the gap 76, and an insulating plate 24 is formed in the slit 74.

Figure 13A:
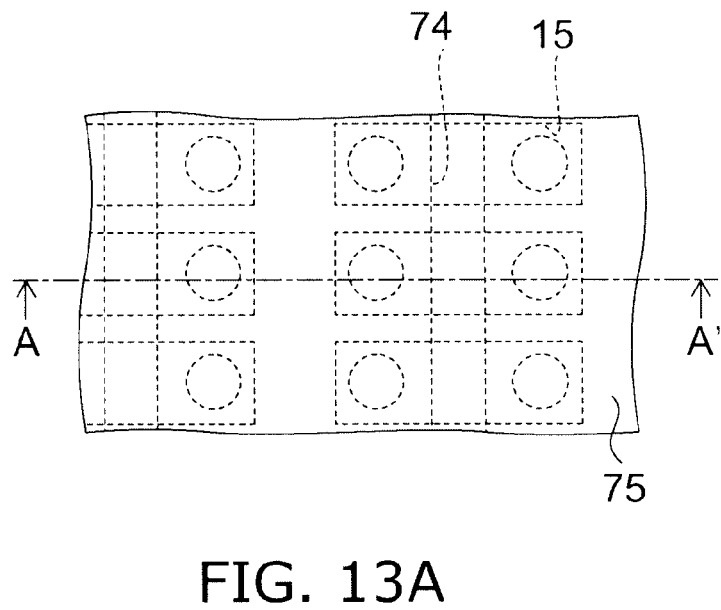
FIG. 13A is a process plan view illustrating a method for manufacturing a nonvolatile semiconductor memory device according to the first embodiment.
Figure 13B:
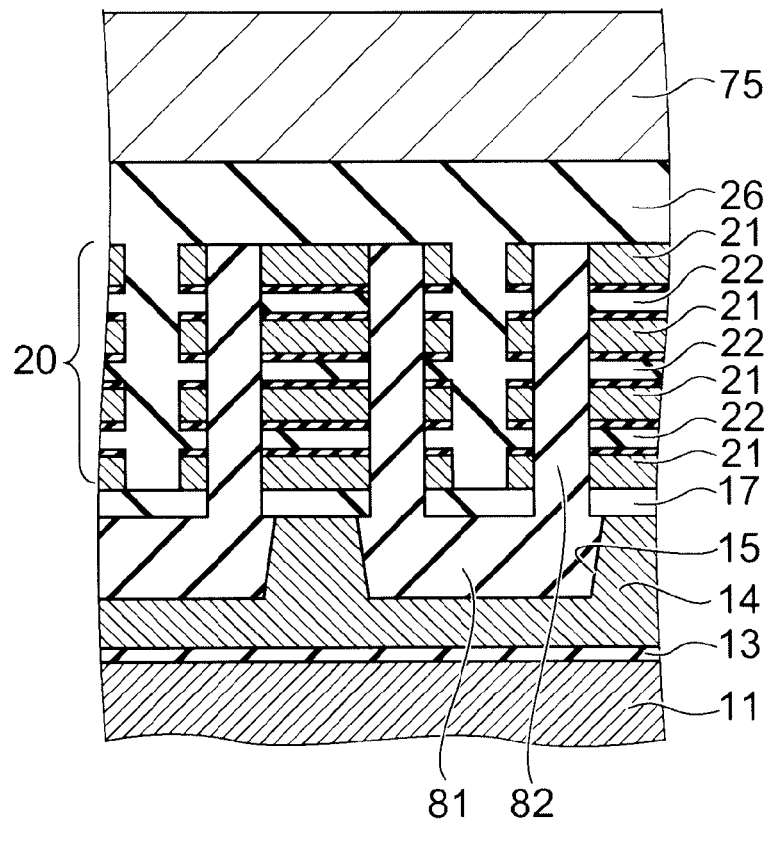
FIG. 13B is a process cross-sectional view taken along line A-A' shown in FIG. 13A.

Next, as shown in FIGS. 13A and 13B, a silicon oxide film 26 is formed on the stacked body 20, and a boron-doped polysilicon film 75 is formed thereon. Here, the film thickness of the silicon oxide film 26 is such that a sufficient breakdown voltage can be ensured between the uppermost electrode film 21 and the boron-doped polysilicon film 75. Furthermore, the film thickness of the boron-doped polysilicon film 75 is such that it can function as a control electrode of the device 1.

Figure 14A:
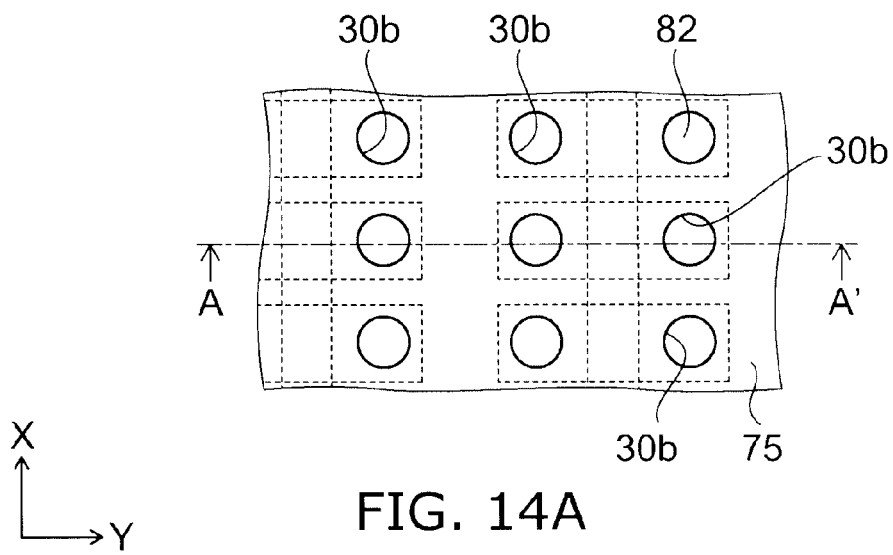
FIG. 14A is a process plan view illustrating a method for manufacturing a nonvolatile semiconductor memory device according to the first embodiment.
Figure 14B:
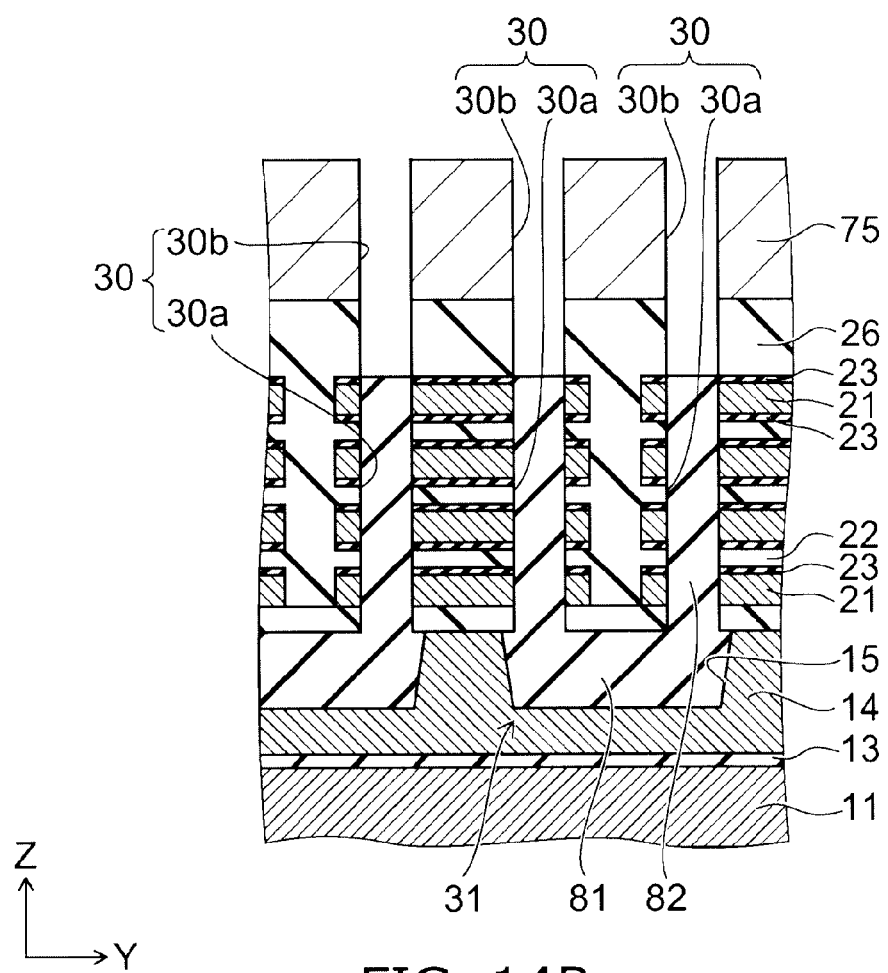
FIG. 14B is a process cross-sectional view taken along line A-A' shown in FIG. 14A.

Next, as shown in FIGS. 14A and 14B, through holes 30b are formed in the boron-doped polysilicon film 75 and the silicon oxide film 26. The through hole 30b is formed immediately above the through hole 30a and caused to communicate with the through hole 30a. The through holes 30a and 30b constitute a continuous through hole 30. Furthermore, the through holes 30 and the recess 15 constitute a U-hole 31.

Figure 15A:
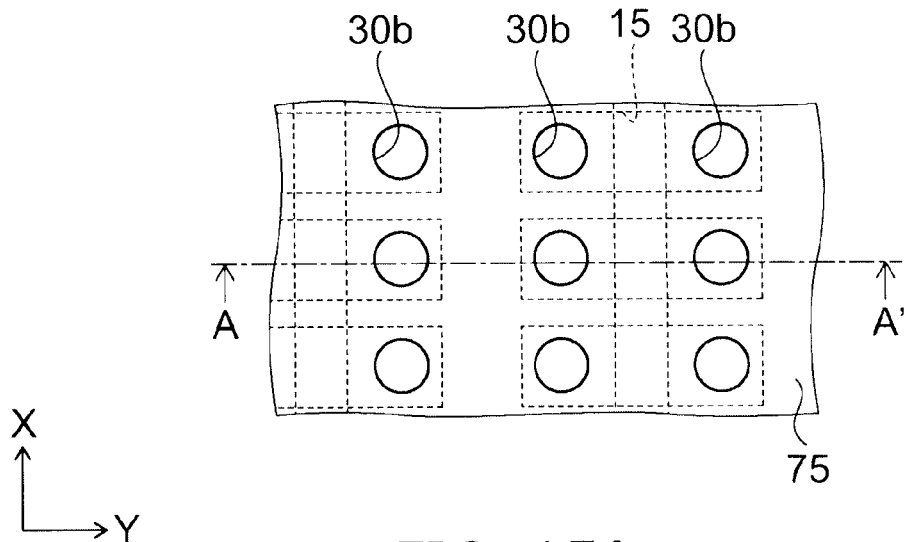
FIG. 15A is a process plan view illustrating a method for manufacturing a nonvolatile semiconductor memory device according to the first embodiment.
Figure 15B:
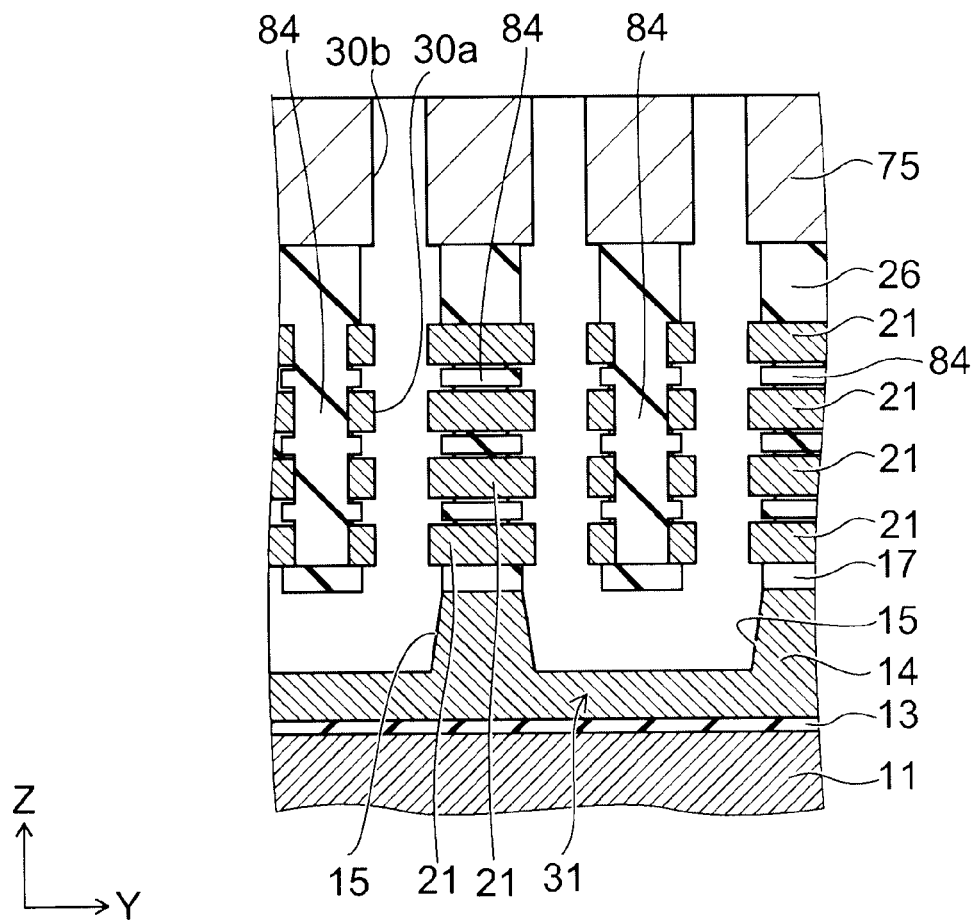
FIG. 15B is a process cross-sectional view taken along line A-A' shown in FIG. 15A.

Next, as shown in FIGS. 15A and 15B, wet etching through the through hole 30b is performed with high temperature phosphoric acid to remove the sacrificial material 82 (see FIG. 14B) from inside the through hole 30a and to remove the sacrificial material 81 (see FIG. 14B) from inside the recess 15. Here, the portion of the silicon nitride layers 78 and 79 exposed into the through hole 30 is removed to some extent to form recesses in the side surface of the through hole 30.

Figure 16A:
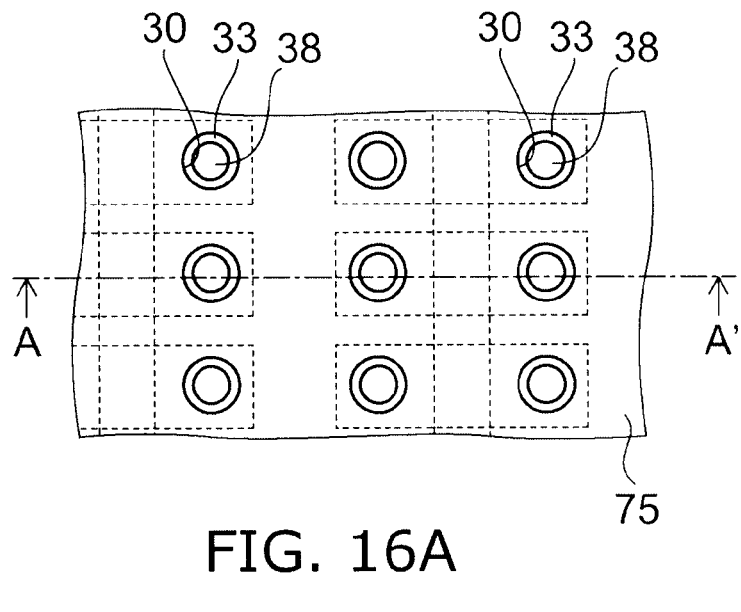
FIG. 16A is a process plan view illustrating a method for manufacturing a nonvolatile semiconductor memory device according to the first embodiment.
Figure 16B:
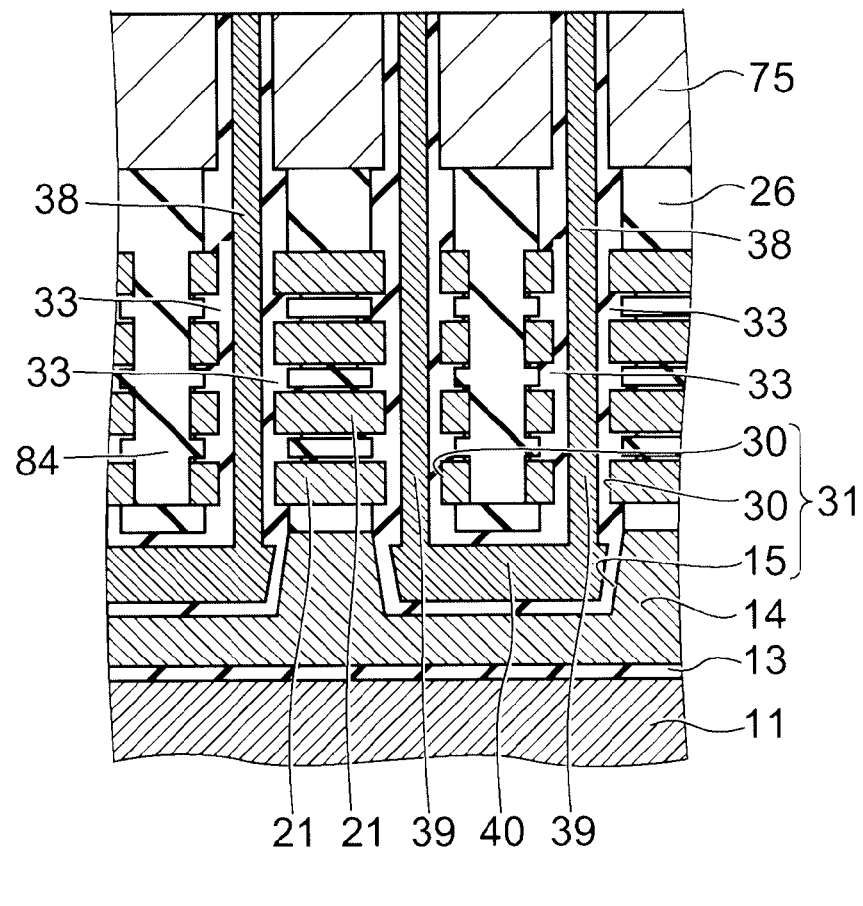
FIG. 16B is a process cross-sectional view taken along line A-A' shown in FIG. 16A.

Next, as shown in FIGS. 16A, 16B, and 3, silicon oxide is deposited illustratively by the ALD process. This silicon oxide penetrates into the U-hole 31 and deposits a block insulating film 35 on the inner surface of the U-hole 31. Next, silicon nitride is deposited. Thus, a charge storage film 36 is formed on the block insulating film 35. Next, silicon oxide is deposited. Thus, a tunnel insulating film 37 is formed on the charge storage film 36. The block insulating film 35, the charge storage film 36, and the tunnel insulating film 37 constitute a memory film 33.

Next, polysilicon containing impurity, such as phosphorus, is buried in the U-hole 31. Thus, a U-pillar 38 is formed in the U-hole 31. In the U-pillar 38, the portion located in the through hole 30 constitutes a silicon pillar 39 extending in the Z direction, and the portion located in the recess 15 constitutes a connecting member 40 extending in the Y direction. Subsequently, etching is performed on the entire surface to remove the polysilicon, the tunnel insulating film 37, the charge storage film 36, and the block insulating film 35 deposited on the boron-doped polysilicon film 75 so that the boron-doped polysilicon film 75 is exposed.

Figure 17A:
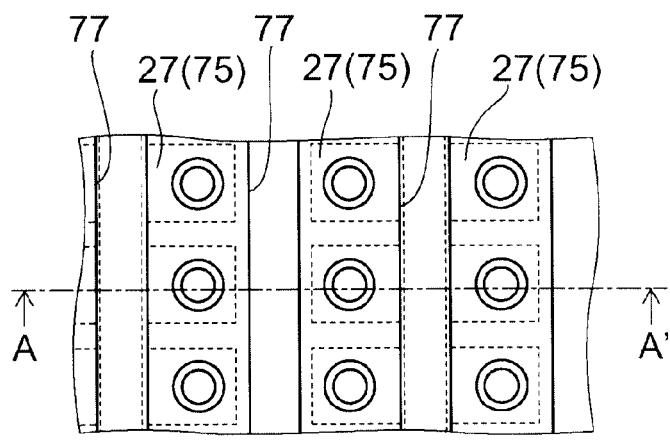
FIG. 17A is a process plan view illustrating a method for manufacturing a nonvolatile semiconductor memory device according to the first embodiment.
Figure 17B:
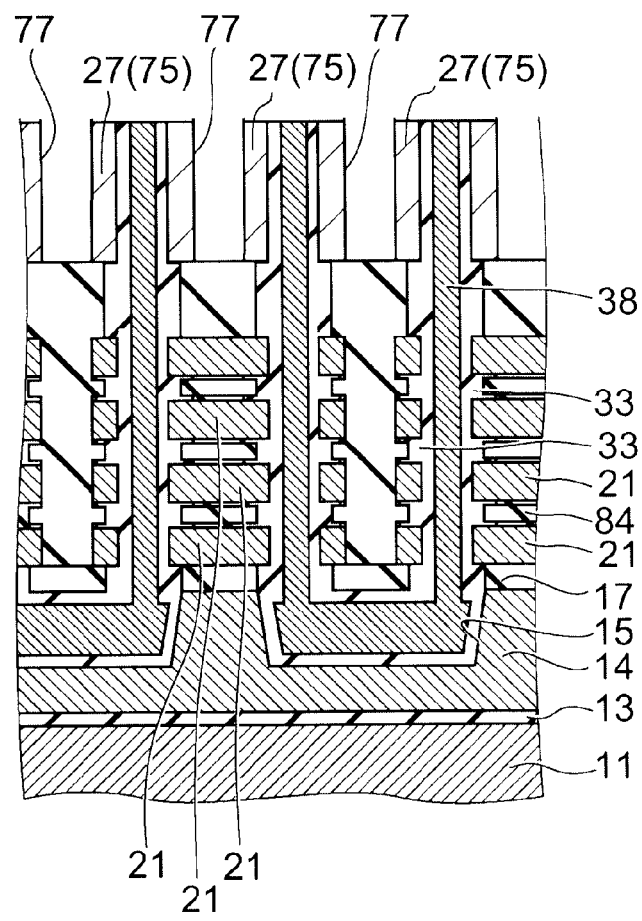
FIG. 17B is a process cross-sectional view taken along line A-A' shown in FIG. 17A.

Next, as shown in FIGS. 17A and 17B, by photolithography and etching, a plurality of slits 77 extending in the X direction are formed in the boron-doped polysilicon film 75 from its upper surface side. Here, the slit 77 is formed between the sequences of a plurality of through holes 30 arranged in the X direction so as to pierce the boron-doped polysilicon film 75 to the silicon oxide film 26. Thus, the boron-doped polysilicon film 75 is divided for each sequence of a plurality of through holes 30 arranged in the X direction and results in a plurality of control electrodes 27 extending in the X direction. Subsequently, silicon oxide is buried in the slit 77.

Next, as shown in FIGS. 1A to 1C and 2, a resist mask (not shown) is formed on the stacked body 20. Slimming of this resist mask and etching using this resist mask as a mask are alternately performed to process the end portion of the stacked body 20 and the control electrode 27 into a staircase pattern. Next, a silicon nitride film 41 is formed on the side surface of the stacked body 20 and the control electrode 27, and the entirety is buried with an interlayer insulating film 42. Next, plugs 43 are formed in the interlayer insulating film 42, and contacts 44 and 45 are formed using the silicon nitride film 41 as a stopper. Subsequently, source lines 47 and wirings 49 and 50 are formed on the interlayer insulating film 42. The interlayer insulating film 42 is further deposited, and plugs 48 are formed therein. Next, bit lines 51 and wirings 52 are formed on the interlayer insulating film 42, a silicon nitride film 54 is formed thereon, and an interlayer insulating film 55 is formed thereon. Thus, the nonvolatile semiconductor memory device 1 according to this embodiment is manufactured.

Next, the function and effect of this embodiment are described.

In this embodiment, in the process shown in FIGS. 7A and 7B, when the through hole 30a is formed in the stacked body 20, the stacked body 20 includes only the boron-doped silicon layer 72, the non-doped silicon layer 73, and the extremely thin silicon nitride layers 78 and 79, and does not include any films difficult to etch, such as silicon oxide film. Thus, the through hole 30 can be formed in a cylindrical shape so that the inner surface is nearly vertical, that is, the taper angle is nearly 90°, without making the lower portion of the through hole 30a narrower than the upper portion. Thus, the diameter of the through hole 30a can be nearly equalized between the memory cell transistor formed in the upper portion of the stacked body 20 and the memory cell transistor formed in the lower portion, and variation in the characteristics of memory cell transistors due to variation in the diameter of the through hole 30 can be suppressed. Consequently, the characteristics of memory cell transistors can be made uniform.

Furthermore, in this embodiment, in the process shown in FIGS. 6A and 6B, the stacked body 20 is formed by stacking the boron-doped silicon layers 72 and the non-doped silicon layers 73. Hence, in the process shown in FIGS. 11A and 11B, when wet etching is performed, high etching selection ratio can be achieved between these layers. This allows only the non-doped silicon layer 73 to be removed while leaving the boron-doped silicon layer 72, which constitutes an electrode film 21 in a later process. Consequently, the completed device 1 has good shape stability, and the characteristics of memory cell transistors are uniform.

Furthermore, in this embodiment, in the process shown in FIGS. 6A and 6B, the silicon nitride layer 78 or 79 is interposed between the boron-doped silicon layer 72 and the non-doped silicon layer 73. This can prevent boron in the boron-doped silicon layer 72 from diffusing into the non-doped silicon layer 73 by heating associated with the CVD process for forming the boron-doped silicon layer 72 and the non-doped silicon layer 73. Thus, it is possible to prevent increase in the thickness and decrease in the boron concentration of the boron-doped silicon layer 72, and to prevent variation in the film thickness and conductivity of the electrode film 21. That is, because the film thickness of the electrode film 21 functioning as a gate electrode of the memory cell transistor is made uniform, the gate length of the memory cell transistor is made uniform, and the distribution of threshold voltage can be reduced. Thus, the characteristics of memory cell transistors can be made uniform.

Moreover, as described above, in this embodiment, in the process shown in FIGS. 11A and 11B, the electrode film 21 can be formed uniformly. Hence, the size of the two gaps 76 formed above and below the electrode film 21, or the gate-to-gate distance, can be made uniform. In general, the effect of surface tension acting on the line portion of a line-and-space structure decreases as the shape of two spaces sandwiching the line becomes uniform. Thus, this embodiment can reduce the effect of surface tension acting on the gate electrode 21.

Moreover, in this embodiment, the silicon nitride layer 78 or 79 having higher hydrophobicity than the boron-doped silicon layer 72 and functioning as a hydrophobic layer is interposed between the boron-doped silicon layer 72 and the non-doped silicon layer 73. Thus, in the process shown in FIGS. 11A and 11B, at the time of wet etching followed by drying, the effect of surface tension of the aqueous etching solution exerted on the boron-doped silicon layer 72 can be suppressed. Consequently, in the drying process, damage to the internal structure of the stacked body 20 can be prevented. For instance, bending of the boron-doped silicon layer 72 can be prevented. This can also make the characteristics of memory cell transistors uniform.

Thus, according to this embodiment, it is possible to easily manufacture a nonvolatile semiconductor memory device 1 with high shape stability, including memory cell transistors with uniform characteristics.

Next, a comparative example of this embodiment is described.

FIGS. 18A to 19B illustrate a method for manufacturing a nonvolatile semiconductor memory device according to this comparative example, where each figure with the suffix A is a process plan view, and each figure with the suffix B is a process sectional view taken along line A-A' shown in the corresponding figure with the suffix A.

This comparative example is different from the above first embodiment in that the silicon nitride layers 78 and 79 are not interposed between the boron-doped silicon layer 72 and the non-doped silicon layer 73.

Figure 18A:
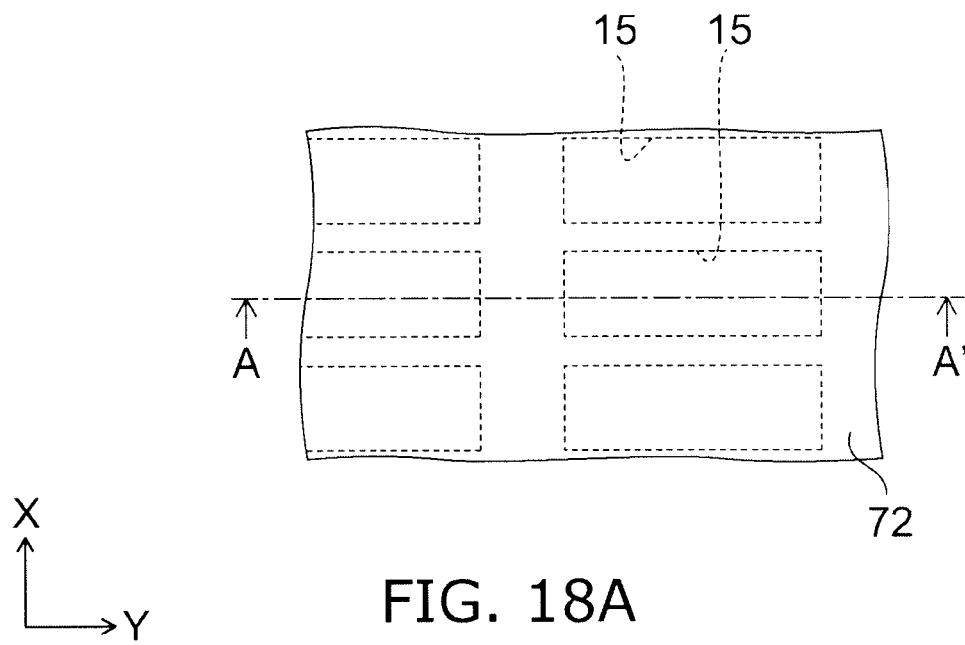
FIG. 18A is a process plan view illustrating a method for manufacturing a nonvolatile semiconductor memory device according to a comparative example of the first embodiment.
Figure 18B:
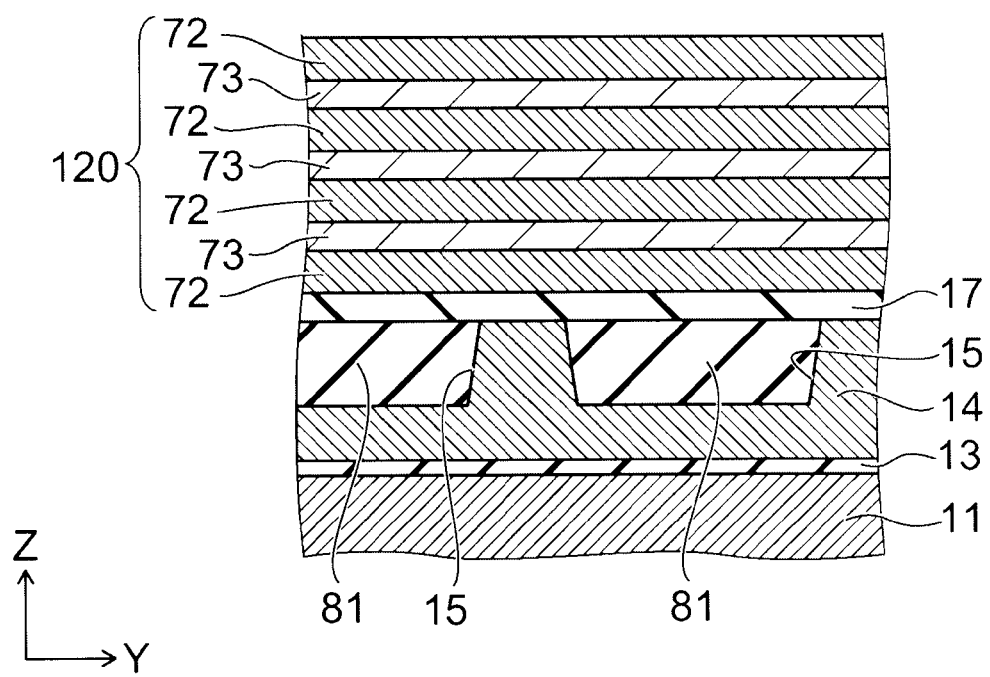
FIG. 18B is a process cross-sectional view taken along line A-A' shown in FIG. 18A.

More specifically, as shown in FIGS. 18A and 18B, a silicon oxide film 13 and a back gate electrode 14 are formed on a silicon substrate 11, and a recess 15 is formed in the upper surface of the back gate electrode 14. Then, a sacrificial material 81 made of silicon nitride is buried in the recess 15, and a silicon oxide film 17 is formed on the entire surface. Next, a stacked body 120 is formed by alternately stacking boron-doped silicon layers 72 and non-doped silicon layers 73. Here, the boron-doped silicon layer 72 is formed by a CVD process at a temperature of 420° C., and the non-doped silicon layer 73 is formed by a CVD process at a temperature of 525° C. Furthermore, no nitridation treatment is performed after the film formation, and hence no silicon nitride layer is formed between the boron-doped silicon layer 72 and the non-doped silicon layer 73. Thus, particularly by heat at the time of forming the non-doped silicon layer 73, boron in the boron-doped silicon layer 72 diffuses into the non-doped silicon layer 73, broadening the boron concentration profile in the Z direction. Furthermore, because the lower portion of the stacked body 120 is formed earlier, it is subsequently subjected to heat treatment more times, and boron diffusion proceeds therein. The subsequent process is similar to that of the above first embodiment.

Figure 19A:
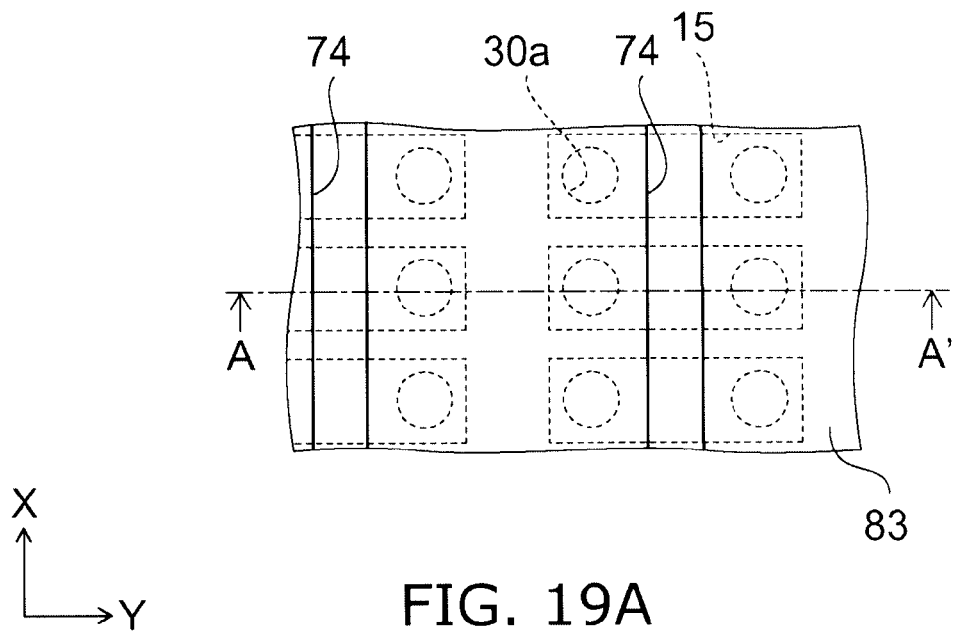
FIG. 19A is a process plan view illustrating a method for manufacturing a nonvolatile semiconductor memory device according to a comparative example of the first embodiment.
Figure 19B:
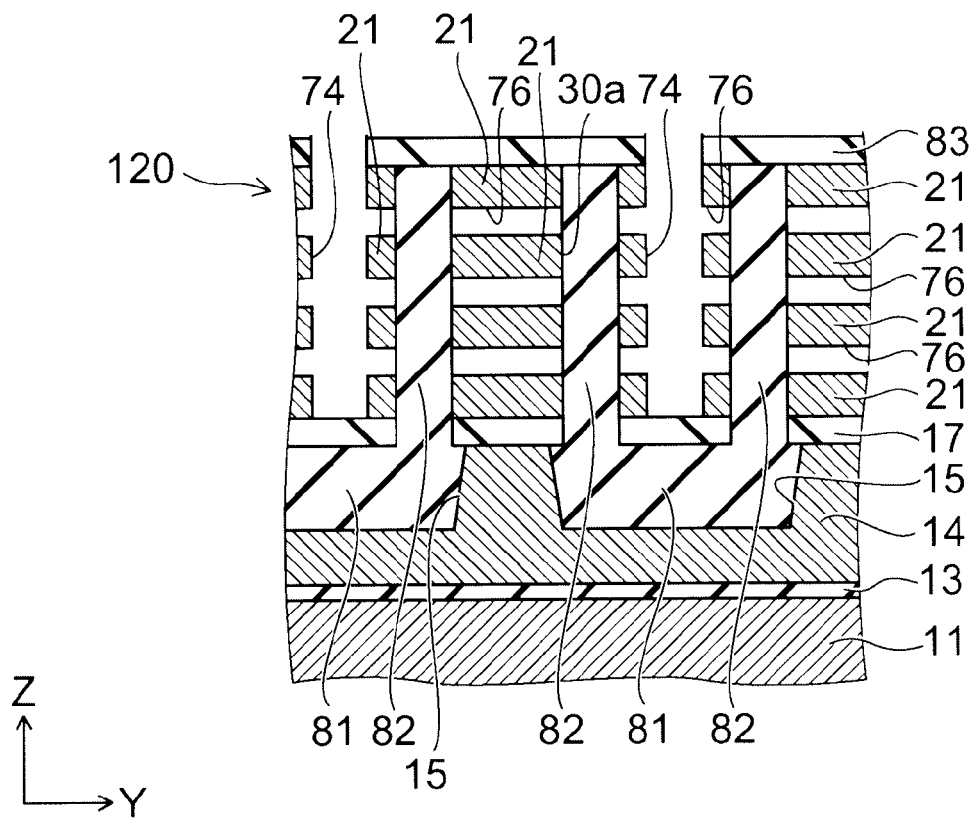
FIG. 19B is a process cross-sectional view taken along line A-A' shown in FIG. 19A.

Thus, as shown in FIGS. 19A and 19B, in the process of removing the non-doped silicon layer 73 by wet etching through the slit 74, the accuracy of wet etching is decreased by combination of the effect of boron diffusion, which causes expansion of the remaining portion after etching, and the effect of the decrease of boron concentration in the boron-doped silicon layer 72, which causes decrease in etching selection ratio. This results in varying the thickness of the boron-doped silicon layer 72 remaining after wet etching, and varying the gate length of the gate electrode. Furthermore, variation in the thickness of the boron-doped silicon layer 72 also causes variation in the size of the gap 76. Thus, the effect of surface tension acting on the boron-doped silicon layer 72 (electrode film 21) increases.

Furthermore, at the time of wet etching, the hydrophilic boron-doped silicon layer 72 is exposed to the aqueous etching solution. Hence, in the subsequent drying process, it is strongly affected by the surface tension of the aqueous etching solution. This may destroy the internal structure of the stacked body 120. Specifically, due to the surface tension of the aqueous etching solution in addition to the self-weight of the boron-doped silicon layer 72, the boron-doped silicon layer 72 may deform and bend, or the adjacent boron-doped silicon layers 72 may be brought into contact with each other. These may lead to non-uniformity in the characteristics of the completed memory cell transistors, or failure in functioning as memory cell transistors.

Next, a second embodiment of the invention is described.

Figure 20:
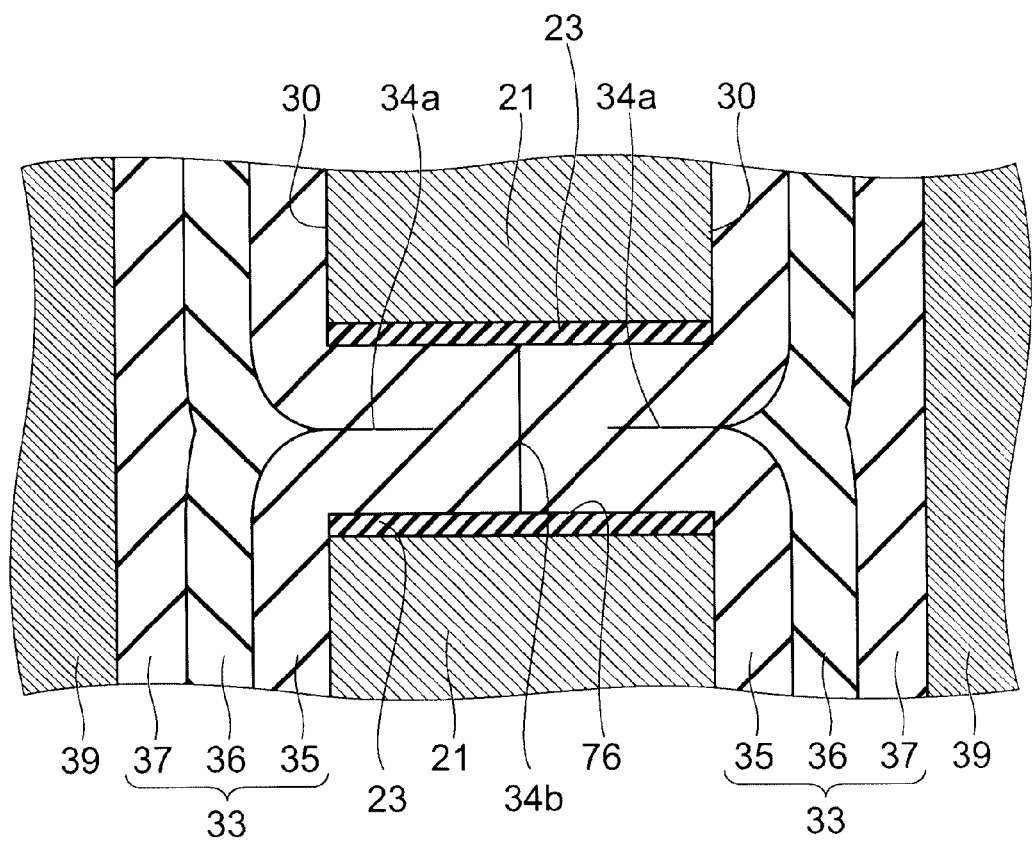
FIG. 20 is a partially enlarged sectional view illustrating a portion between electrode films in a nonvolatile semiconductor memory device according to a second embodiment.

FIG. 20 is a partially enlarged sectional view illustrating a portion between electrode films in a nonvolatile semiconductor memory device according to this embodiment.

The overall configuration of the nonvolatile semiconductor memory device 2 (hereinafter also simply referred to as "device 2") according to this embodiment is similar to the configuration of the device 1 shown in FIGS. 1A to 1C and 2. However, in the device 2, as shown in FIG. 20, the insulating film 22 (see FIG. 3) is not provided, but the block insulating film 35 penetrates into the portion between the electrode films 21. That is, in the device 2, the block insulating film 35 extends out from above the inner surface of the through hole 30 onto the upper and lower surface of the electrode films 21 and reaches the insulating plate 24 (see FIGS. 1A to 1C) dividing the electrode films 21.

In the block insulating film 35, the portion located on the upper surface of one electrode film 21 is in contact with the portion located on the lower surface of another electrode film 21 located one level above the former electrode film 21, and a seam 34a is formed at the contact surface. Thus, the space between the electrode films 21 adjacent in the Z direction is filled with the block insulating film 35. Furthermore, the block insulating film 35 penetrating into the space between the electrode films 21 by extending from above the inner surface of one through hole 30 onto the upper and lower surface of the electrode films 21 is in contact with the block insulating film 35 penetrating into the space between the same electrode films 21 by extending from above the inner surface of the adjacent through hole 30 onto the upper and lower surface of the same electrode films 21, and a seam 34b is formed at the contact surface. At the seams 34a and 34b, the microstructure of the block insulating film 35 is discontinuous, and the seams 34a and 34b can be observed by applying chemical treatment and the like to the cross section including the seams 34a and 34b. It is noted that the charge storage film 36 and the tunnel insulating film 37 formed on the block insulating film 35 do not penetrate into the gap 76 between the electrode films 21. The configuration of this embodiment other than the foregoing is similar to that of the above first embodiment.

FIGS. 21A to 30B illustrate a method for manufacturing a nonvolatile semiconductor memory device according to this embodiment, where each figure with the suffix A is a process plan view, and each figure with the suffix B is a process sectional view taken along line A-A' shown in the corresponding figure with the suffix A.

Here, FIGS. 21A to 30B show the memory array region Rm.

First, as shown in FIGS. 1A to 1C, as in the above first embodiment, STI 12 is selectively formed in the upper portion of a silicon substrate 11, transistors 61 are formed in the peripheral circuit region Rc, and a silicon oxide film 13 is formed on the upper surface of the silicon substrate 11 in the memory array region Rm.

Figure 21A:
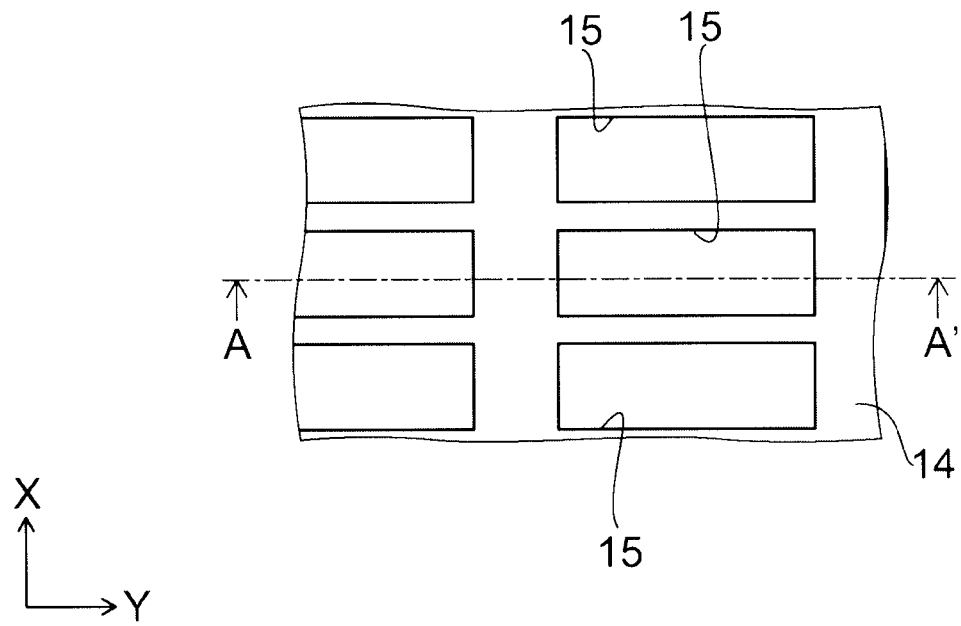
FIG. 21A is a process plan view illustrating a method for manufacturing a nonvolatile semiconductor memory device according to the second embodiment.
Figure 21B:
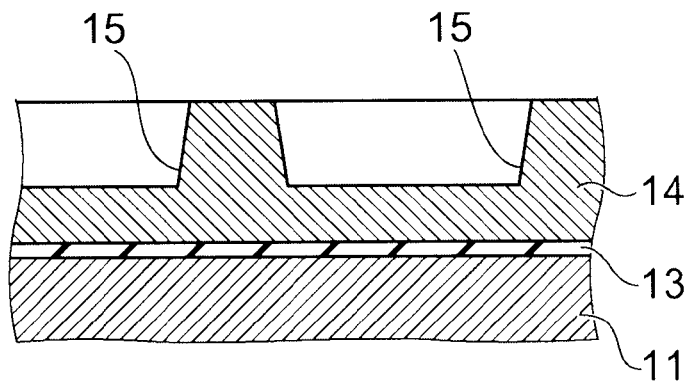
FIG. 21B is a process cross-sectional view taken along line A-A' shown in FIG. 21A.

Next, as shown in FIGS. 21A and 21B, a back gate electrode 14 made of boron-doped polysilicon is formed in the memory array region Rm, and a recess 15 is formed in the upper surface of the back gate electrode 14.

The subsequent process is different from that of the above first embodiment.

Figure 22A:
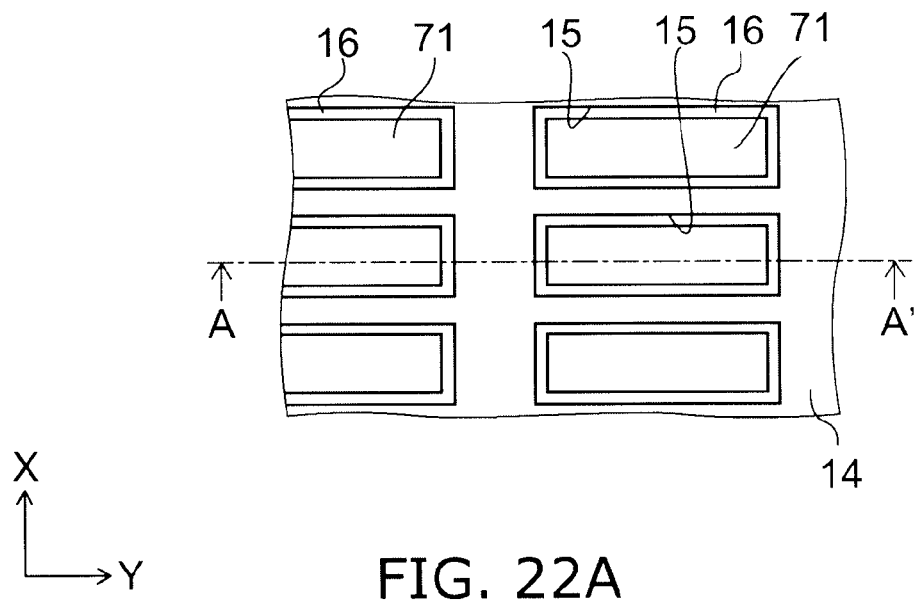
FIG. 22A is a process plan view illustrating a method for manufacturing a nonvolatile semiconductor memory device according to the second embodiment.
Figure 22B:
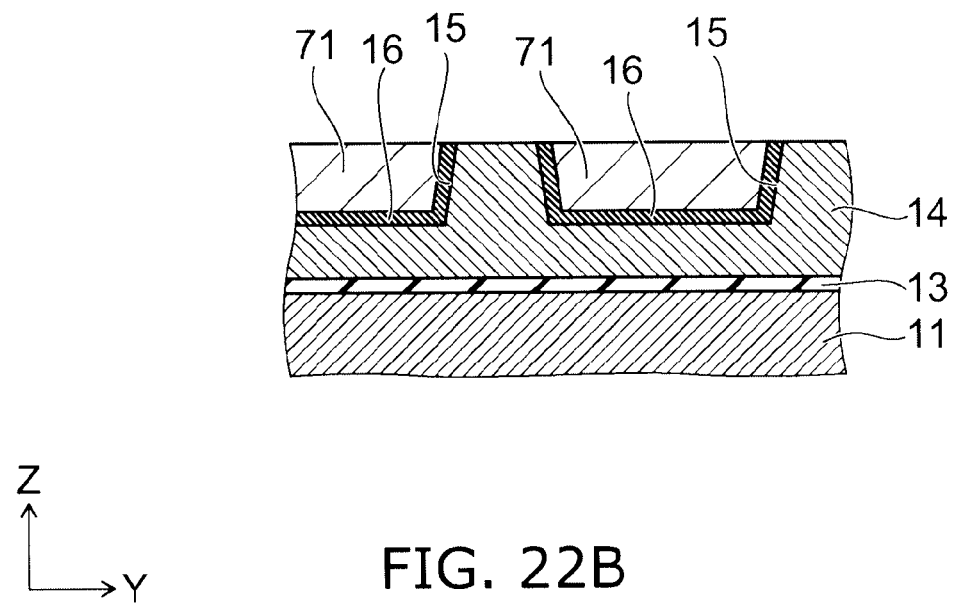
FIG. 22B is a process cross-sectional view taken along line A-A' shown in FIG. 22A.

More specifically, as shown in FIGS. 22A and 22B, a silicon oxide film 16 is formed on the inner surface of the recess 15. Next, silicon not doped with impurity (non-doped silicon) is deposited on the entire surface, and entire surface etching is performed. Thus, the non-doped silicon is removed from above the upper surface of the back gate electrode 14 and left in the recess 15. Consequently, the region of the upper surface of the back gate electrode 14 between the recesses 15 is exposed, and a non-doped silicon material 71 is buried in the recess 15.

Figure 23A:
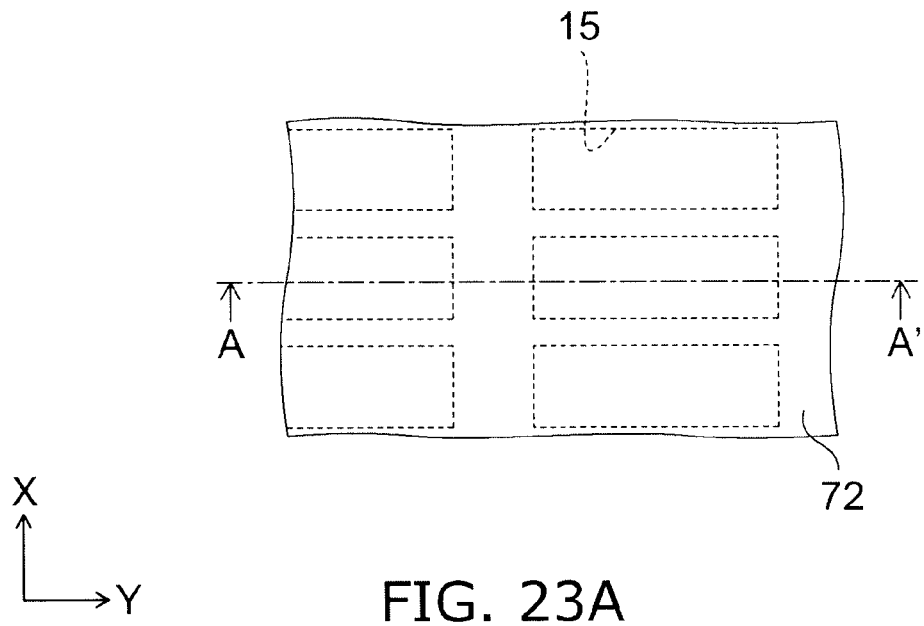
FIG. 23A is a process plan view illustrating a method for manufacturing a nonvolatile semiconductor memory device according to the second embodiment.
Figure 23B:
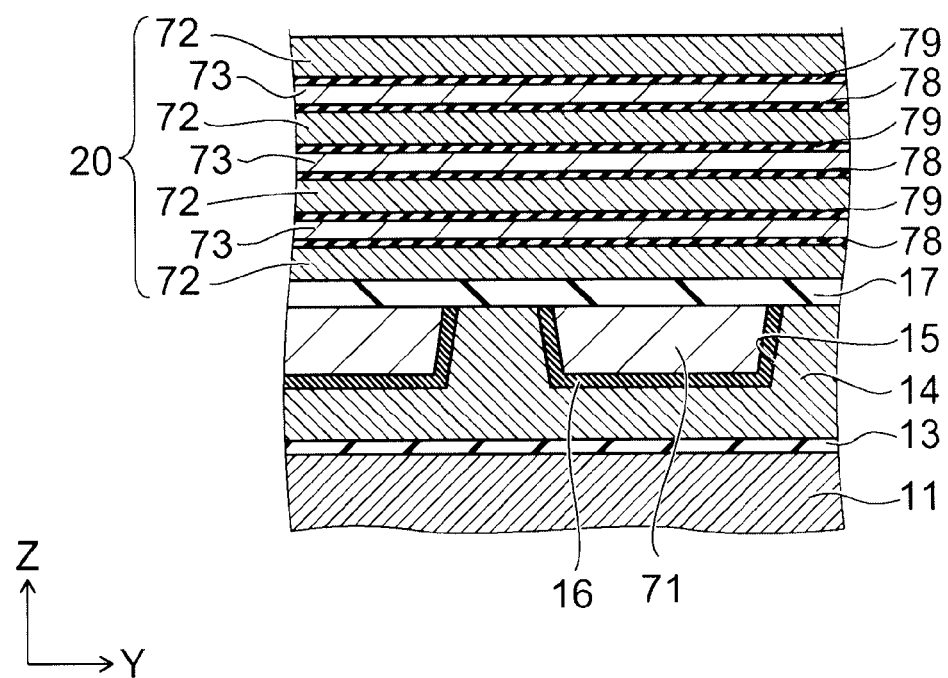
FIG. 23B is a process cross-sectional view taken along line A-A' shown in FIG. 23A.

Next, as shown in FIGS. 23A and 23B, a silicon oxide film 17 is formed entirely on the back gate electrode 14. Next, a stacked body 20 is formed by a method similar to that of the above first embodiment. More specifically, a sequential process of depositing a boron-doped silicon layer 72 illustratively by a CVD process, forming a silicon nitride layer 78 illustratively by nitridation treatment, depositing a non-doped silicon layer 73 illustratively by a CVD process, and forming a silicon nitride layer 79 illustratively by nitridation treatment, is repeated a prescribed number of times. Here, as in the above first embodiment, the silicon nitride layers 78 and 79 function as boron diffusion preventing layers.

Figure 24A:
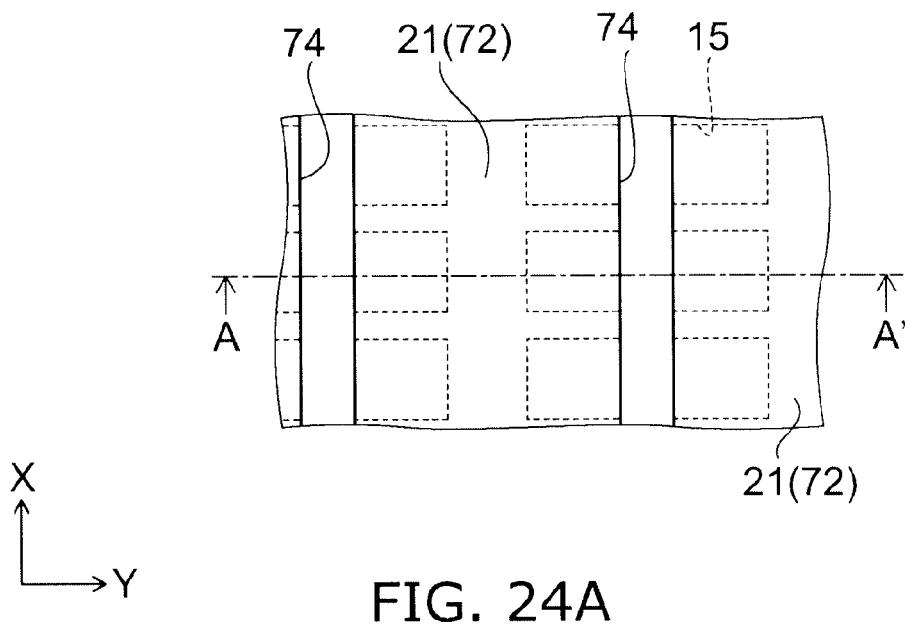
FIG. 24A is a process plan view illustrating a method for manufacturing a nonvolatile semiconductor memory device according to the second embodiment.
Figure 24B:
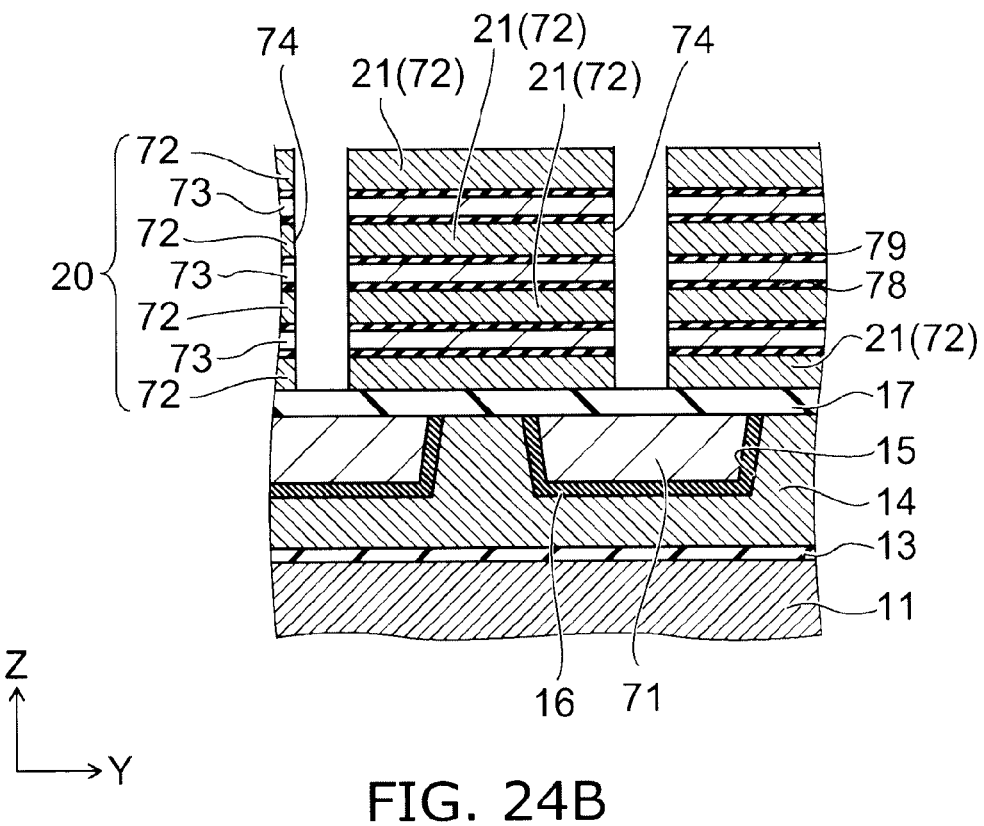
FIG. 24B is a process cross-sectional view taken along line A-A' shown in FIG. 24A.

Next, as shown in FIGS. 24A and 24B, by photolithography and etching, a plurality of slits 74 extending in the X direction are formed in the stacked body 20 from its upper surface side. Each slit 74 is formed so as to pierce the stacked body 20 in the Z direction, not to pierce the silicon oxide film 17, and to pass through immediately above the center portion in the Y direction of the recess 15. Thus, the boron-doped silicon layer 72 is divided into a plurality of electrode films 21.

Figure 25A:
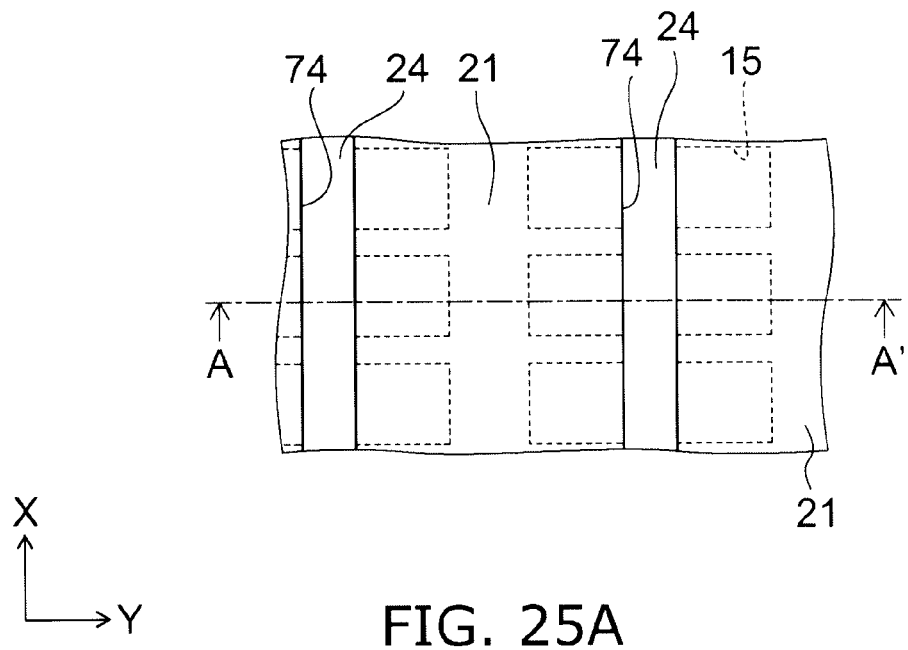
FIG. 25A is a process plan view illustrating a method for manufacturing a nonvolatile semiconductor memory device according to the second embodiment.
Figure 25B:
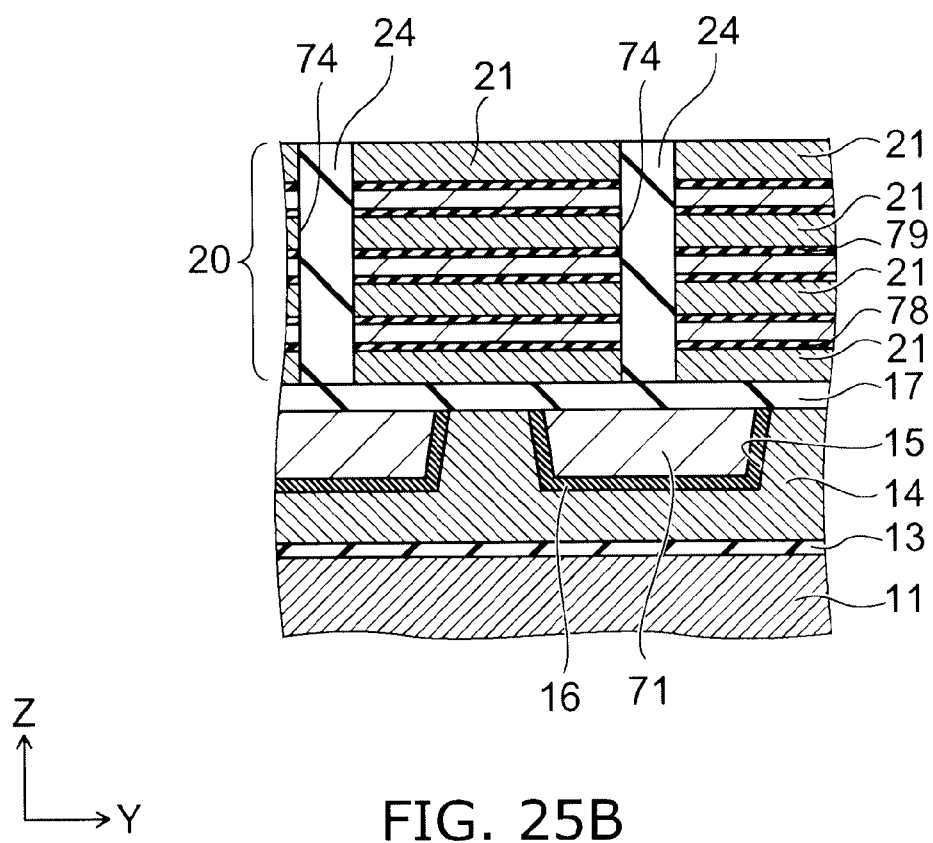
FIG. 25B is a process cross-sectional view taken along line A-A' shown in FIG. 25A.

Next, as shown in FIGS. 25A and 25B, an insulating material such as silicon oxide is deposited on the entire surface. Here, this insulating material is buried also in the slit 74. Subsequently, entire surface etching is performed so that the insulating material is removed from above the upper surface of the stacked body 20 and left in the slit 74. Thus, an insulating plate 24 extending like a plate in the X and Z direction is formed in the slit 74. Furthermore, the uppermost electrode film 21 is exposed to the upper surface of the stacked body 20.

Figure 26A:
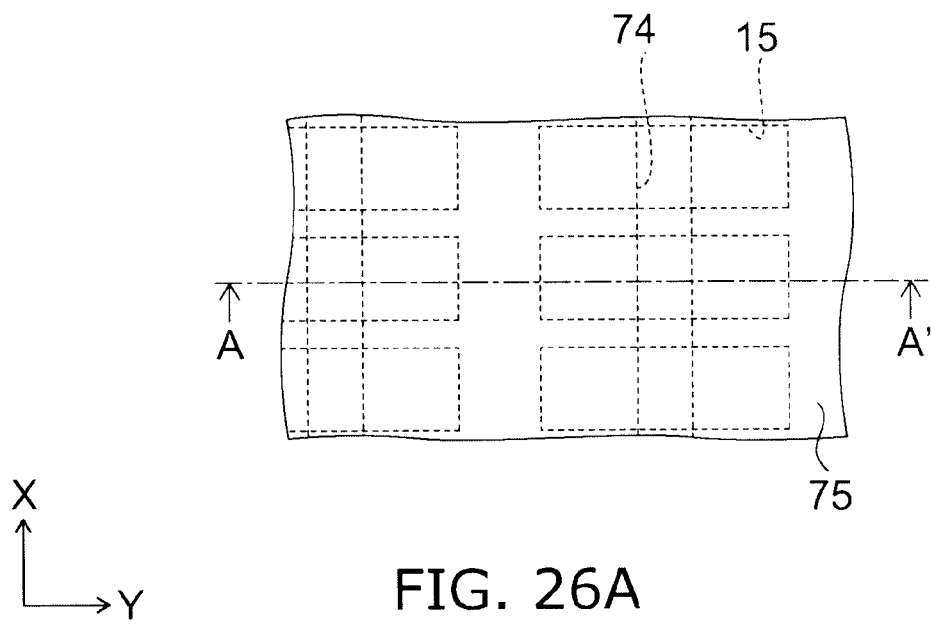
FIG. 26A is a process plan view illustrating a method for manufacturing a nonvolatile semiconductor memory device according to the second embodiment.
Figure 26B:
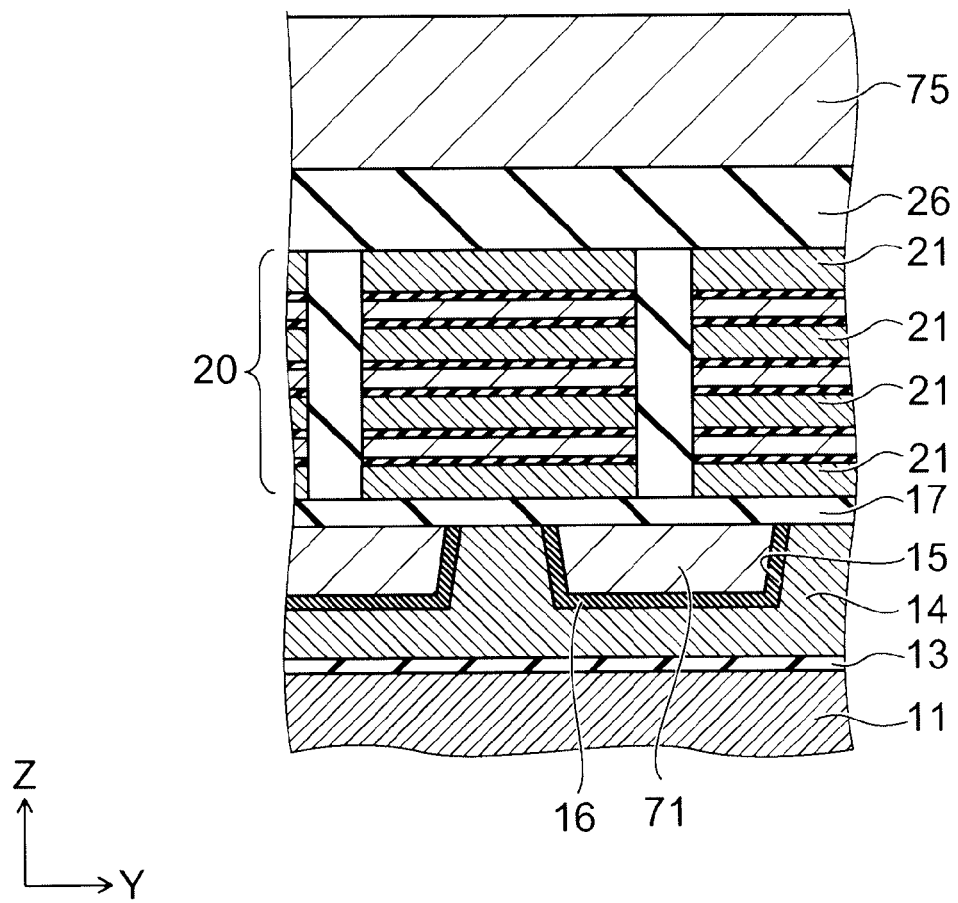
FIG. 26B is a process cross-sectional view taken along line A-A' shown in FIG. 26A.

Next, as shown in FIGS. 26A and 26B, a silicon oxide film 26 is formed on the stacked body 20, and a boron-doped polysilicon film 75 is formed thereon.

Figure 27A:
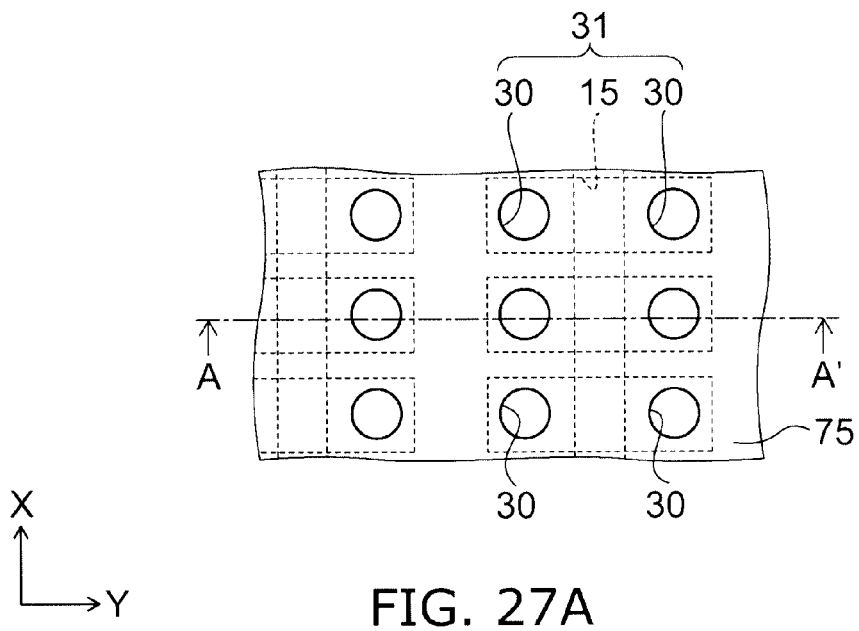
FIG. 27A is a process plan view illustrating a method for manufacturing a nonvolatile semiconductor memory device according to the second embodiment.
Figure 27B:
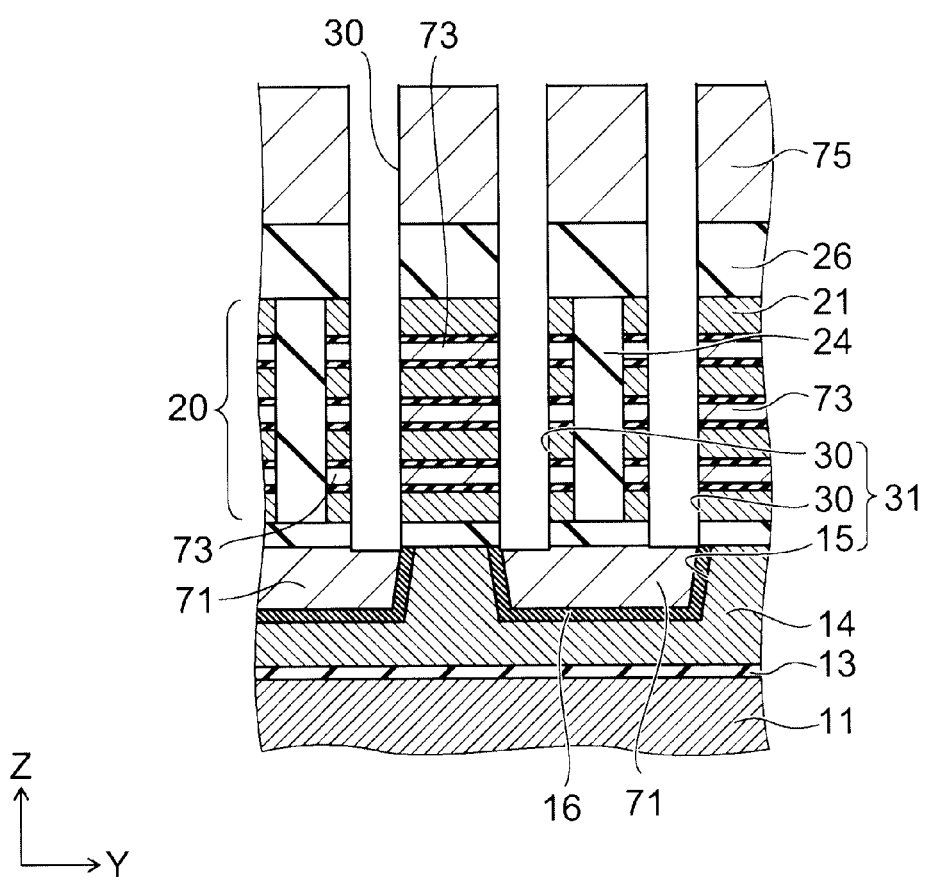
FIG. 27B is a process cross-sectional view taken along line A-A' shown in FIG. 27A.

Next, as shown in FIGS. 27A and 27B, by photolithography and etching, a plurality of through holes 30 extending in the Z direction are formed so as to pierce the boron-doped polysilicon film 75, the silicon oxide film 26, and the stacked body 20. The through holes 30 are collectively formed by dry etching. The through holes 30 are arranged in a matrix along the X and Y direction so that a pair of through holes 30 adjacent in the Y direction reach both end portions in the Y direction of the recess 15. Thus, a pair of through holes 30 communicate with both ends of one recess 15 to form a U-hole 31.

Figure 28A:
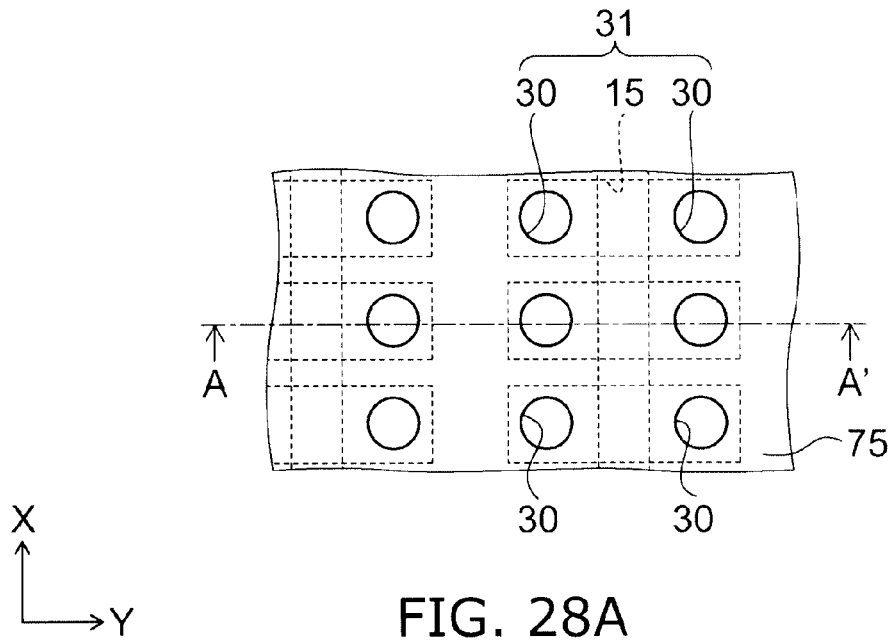
FIG. 28A is a process plan view illustrating a method for manufacturing a nonvolatile semiconductor memory device according to the second embodiment.
Figure 28B:
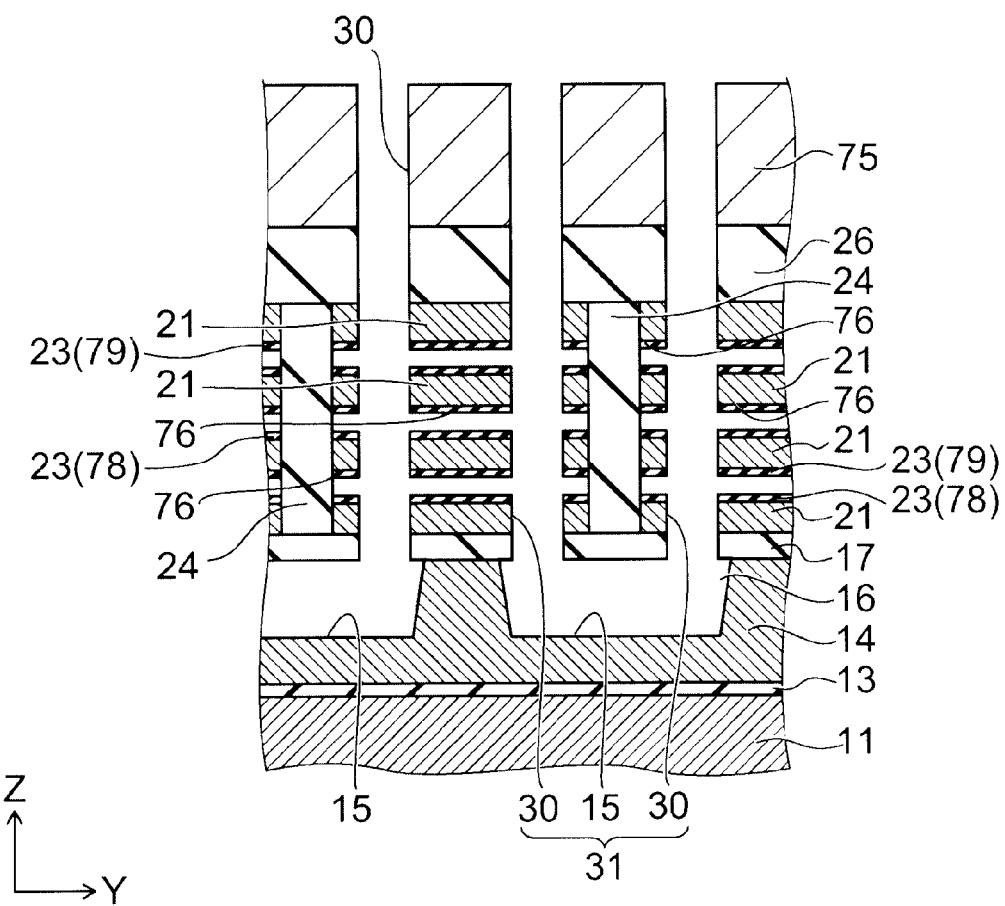
FIG. 28B is a process cross-sectional view taken along line A-A' shown in FIG. 28A.

Next, as shown in FIGS. 28A and 28B, wet etching is performed through the through hole 30. This wet etching is performed illustratively using an alkaline aqueous etching solution. Thus, the non-doped silicon layer 73 (see FIG. 27B) in the stacked body 20 and the non-doped silicon material 71 (see FIG. 27B) in the recess 15 are removed. Consequently, a gap 76 is formed between the electrode films 21 in the Z direction. Here, the electrode films 21 are supported by the plate-like insulating plate 24. In FIG. 28B, the portion of the electrode film 21 located between the U-hole 31 is depicted as floating in the air. However, in reality, at a position shifted in the X direction (in FIG. 28B, the direction perpendicular to the page), it is connected to the portion of the electrode film 21 joined to the insulating plate 24.

Next, the stacked body 20 is dried. Thus, the aqueous etching solution is removed also from inside the gap 76. Here, as in the above first embodiment, the silicon nitride layers 78 and 79 function as hydrophobic layers 23. This can reduce the effect of surface tension of the aqueous etching solution exerted on the internal structure of the stacked body 20.

Figure 29A:
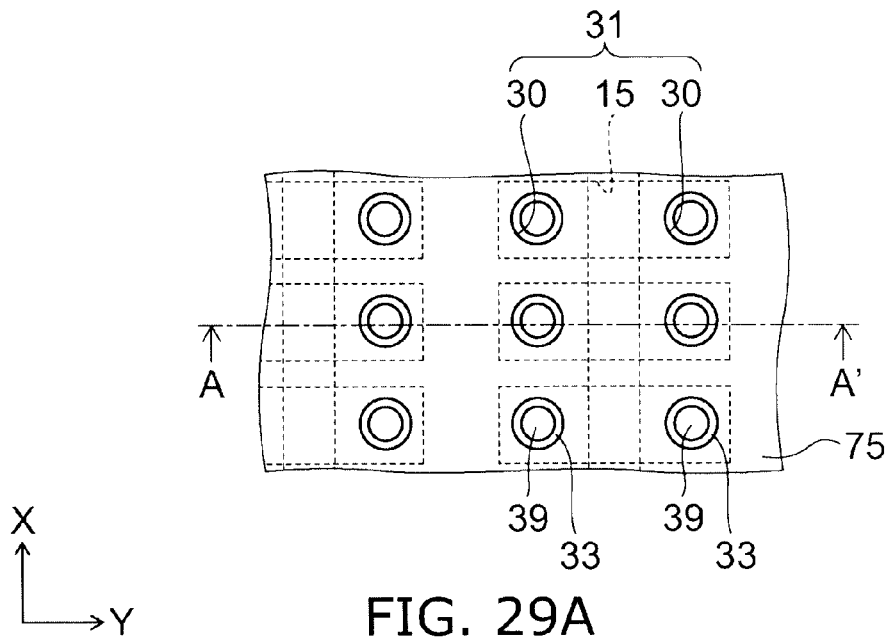
FIG. 29A is a process plan view illustrating a method for manufacturing a nonvolatile semiconductor memory device according to the second embodiment.
Figure 29B:
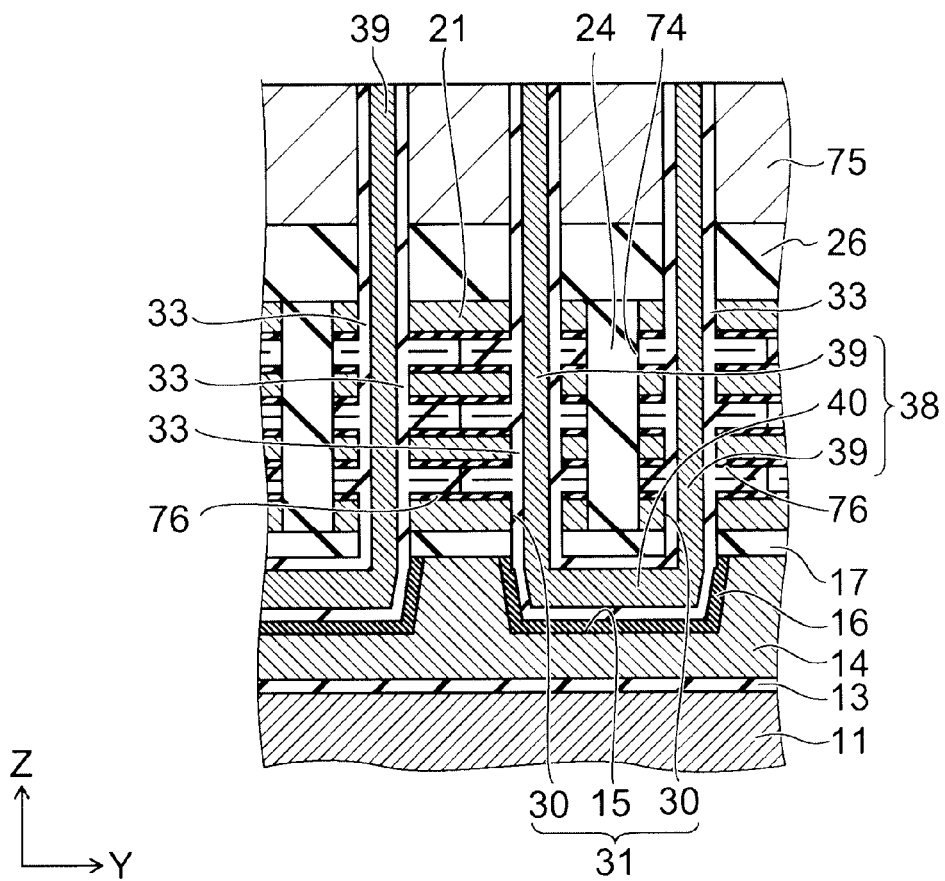
FIG. 29B is a process cross-sectional view taken along line A-A' shown in FIG. 29A.

Next, as shown in FIGS. 29A, 29B, and 20, silicon oxide is deposited illustratively by the ALD process. This silicon oxide penetrates into the U-hole 31 and deposits a block insulating film 35 on the inner surface of the U-hole 31. Furthermore, the silicon oxide penetrates also into the gap 76 through the through hole 30 and deposits a block insulating film 35 also on the inner surface of the gap 76, that is, on the upper and lower surface of the electrode film 21 and on the surface of the insulating plate 24 exposed into the gap 76. In this embodiment, the amount of deposition of the block insulating film 35 is half or more of the distance between the electrode films 21 in the Z direction. Thus, as shown in FIG. 20, the gap 76 is completely filled with the block insulating film 35. In the block insulating film 35, the portion formed on the upper surface of the electrode film 21 is brought into contact with the portion formed on the lower surface of the electrode film 21 located one level above the former electrode film 21, and a seam 34a is formed at the contact surface between these portions. Furthermore, the block insulating films 35 penetrated into the same gap 76 through the adjacent through holes 30 are brought into contact with each other in the gap 76, and a seam 34b is formed at the contact surface.

Next, silicon nitride is deposited. Thus, a charge storage film 36 is formed on the block insulating film 35. Here, because the gap 76 is filled with the block insulating film 35, the charge storage film 36 does not penetrate into the gap 76, but is formed only in the U-hole 31. Next, silicon oxide is deposited. Thus, a tunnel insulating film 37 is formed on the charge storage film 36. The tunnel insulating film 37 also does not penetrate into the gap 76, but is formed only in the U-hole 31. The block insulating film 35, the charge storage film 36, and the tunnel insulating film 37 constitute a memory film 33.

Next, polysilicon containing impurity, such as phosphorus, is buried in the U-hole 31. Thus, a U-pillar 38 is formed in the U-hole 31. In the U-pillar 38, the portion located in the through hole 30 constitutes a silicon pillar 39 extending in the Z direction, and the portion located in the recess 15 constitutes a connecting member 40 extending in the Y direction. Subsequently, etching is performed on the entire surface to remove the polysilicon, the tunnel insulating film 37, the charge storage film 36, and the block insulating film 35 deposited on the boron-doped polysilicon film 75 so that the boron-doped polysilicon film 75 is exposed.

Figure 30A:
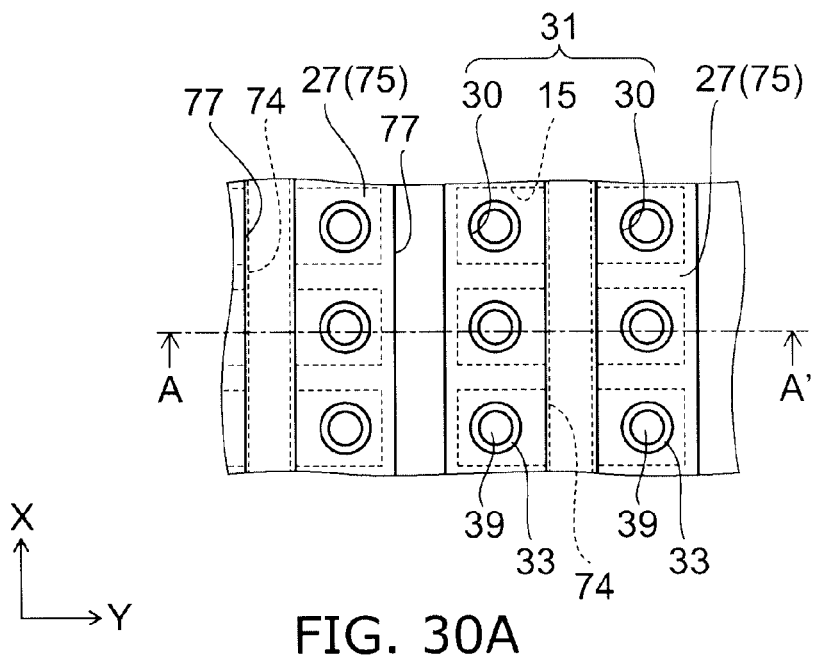
FIG. 30A is a process plan view illustrating a method for manufacturing a nonvolatile semiconductor memory device according to the second embodiment.
Figure 30B:
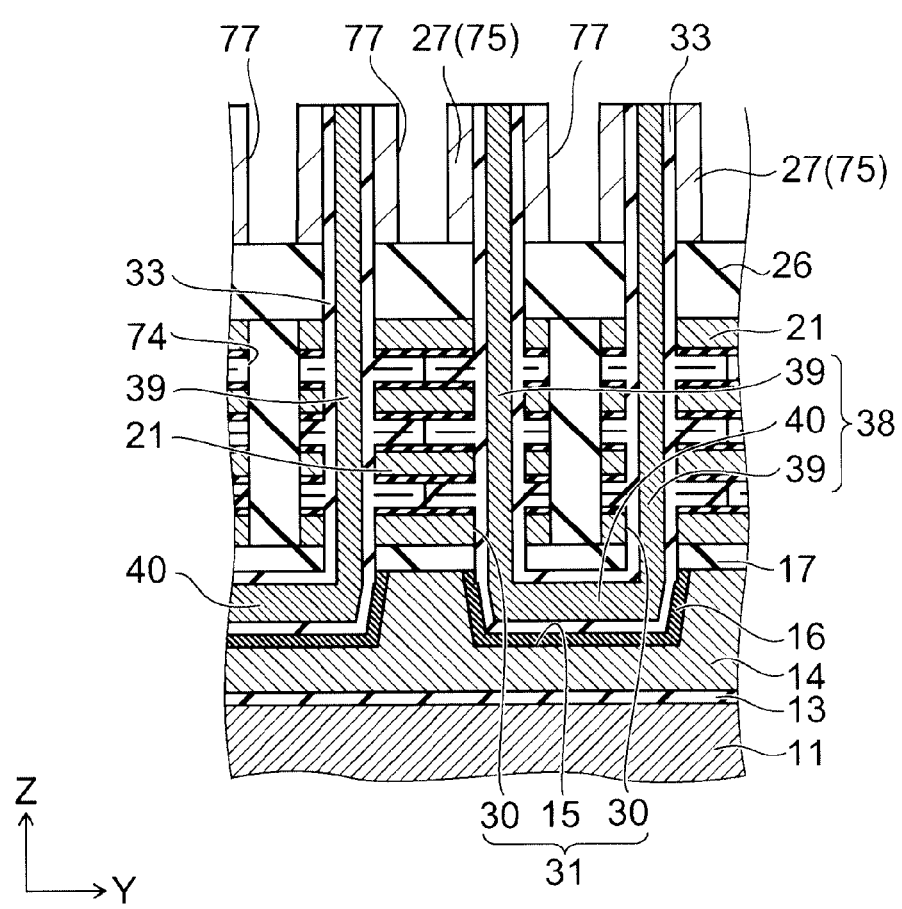
FIG. 30B is a process cross-sectional view taken along line A-A' shown in FIG. 30A.

Next, as shown in FIGS. 30A and 30B, by photolithography and etching, a plurality of slits 77 extending in the X direction are formed in the boron-doped polysilicon film 75 from its upper surface side. Here, the slit 77 is formed between the sequences of a plurality of through holes 30 arranged in the X direction so as to pierce the boron-doped polysilicon film 75 to the silicon oxide film 26. Thus, the boron-doped polysilicon film 75 is divided for each sequence of a plurality of through holes 30 arranged in the X direction and results in a plurality of control electrodes 27 extending in the X direction. Subsequently, silicon oxide is buried in the slit 77.

The subsequent process is similar to that of the above first embodiment. More specifically, as shown in FIGS. 1A to 1C and 2, the end portion of the stacked body 20 is processed into a staircase pattern, the stacked body 20 is buried with an interlayer insulating film 42, and wirings, plugs, contacts and the like such as source lines 47 and bit lines 51 are formed. Thus, the nonvolatile semiconductor memory device 2 according to this embodiment is manufactured. The manufacturing method of this embodiment other than the foregoing is similar to that of the above first embodiment.

This embodiment can also achieve effects similar to those of the above first embodiment. More specifically, when the through hole 30 is formed, the stacked body 20 does not include any films difficult to etch, such as silicon oxide film. Hence, the through hole 30 can be formed with a uniform diameter. Furthermore, because the boron-doped silicon layers 72 and the non-doped silicon layers 73 are stacked in the stacked body 20, only the non-doped silicon layer 73 can be removed with high etching selection ratio in the subsequent wet etching process. Furthermore, because the silicon nitride layers 78 and 79 function as boron diffusion preventing layers, the boron concentration profile in the stacked body 20 is not broadened. Moreover, because the silicon nitride layers 78 and 79 function as hydrophobic layers, the internal structure of the stacked body 20 is not destroyed by the surface tension of the aqueous etching solution for removing the non-doped silicon layer 73. Thus, also in this embodiment, it is possible to easily manufacture a nonvolatile semiconductor memory device with high shape stability, including memory cell transistors with uniform characteristics.

Furthermore, according to this embodiment, in addition to these effects, in the process shown in FIGS. 28A and 28B, the electrode films 21 are supported by the plate-like insulating plate 24 after the non-doped silicon layer 73 is removed. Thus, the intermediate structure in this process has high strength and is easy to handle.

For instance, in the above embodiments, the silicon nitride layers 78 and 79 are formed illustratively by nitridation treatment, but the invention is not limited thereto. For instance, the silicon nitride layer may be deposited by the CVD process. Furthermore, in the above embodiments, the layer formed as a hydrophobic layer is illustratively the silicon nitride layer 78 and 79, but the invention is not limited thereto, as long as the layer can be formed in the semiconductor process and has higher hydrophobicity than the electrode film 21. For instance, a silicon oxide layer typically has higher hydrophilicity than a silicon layer, but can be turned into a layer having higher hydrophobicity than a silicon layer by suitable preprocessing before drying. Hence, a silicon oxide layer suitably preprocessed before drying can also be used as a hydrophobic layer. Alternatively, a conductive layer can be formed as a hydrophobic layer to reduce the gate resistance of the memory cell transistor. Furthermore, in the above embodiments, an alkaline etching liquid is illustratively used as an etching liquid for removing the non-doped silicon layer 73, but the invention is not limited thereto.

Moreover, in the above embodiments, the memory string is illustratively constructed along the U-shaped U-pillar 38, but the invention is not limited thereto. A source line instead of the back gate electrode 14 may be located between the silicon substrate 11 and the stacked body 20, an I-shaped silicon pillar may be connected between a bit line located above the stacked body 20 and the source line located below the stacked body 20, and a memory string may be constructed along this silicon pillar.

While certain embodiments have been described, these embodiments have been presented by way of example only, and are not intended to limit the scope of the inventions. Indeed, the novel devices and methods describes herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the invention.

The invention claimed is:

1. A nonvolatile semiconductor memory device comprising:
a substrate;
a stacked body provided on the substrate, with a plurality of insulating films alternately stacked with a plurality of electrode films, and including a hydrophobic layer provided between one of the insulating films and one of the electrode films, the hydrophobic layer having higher hydrophobicity than the electrode films;
a plurality of semiconductor pillars extending in a stacking direction of the stacked body and piercing the stacked body; and
a charge storage film provided between the electrode films and one of the semiconductor pillars.

2. The device according to claim 1, wherein
the electrode films are made of silicon doped with boron,
the insulating films are made of silicon oxide, and
the hydrophobic layer is made of silicon nitride.

3. The device according to claim 1, further comprising:
an insulating plate provided between the semiconductor pillars in the stacked body and dividing each of the electrode films into a plurality of portions extending in a direction parallel to each other.

4. The device according to claim 3, wherein
the electrode films are made of silicon doped with boron,
the insulating films are made of silicon oxide,
the hydrophobic layer is made of silicon nitride, and
the insulating plate is made of silicon oxide.

5. The device according to claim 1, wherein a diameter of an upper end portion of the semiconductor pillars is equal to a diameter of a lower end portion of the semiconductor pillars.

6. The device according to claim 1, further comprising:
a back gate electrode located between the substrate and the stacked body; and
a connecting member provided in the back gate electrode and connecting two adjacent ones of the semiconductor pillars to each other.

7. The device according to claim 1, wherein
the insulating films are made of silicon oxide,
the hydrophobic layer is made of silicon nitride, and
the hydrophobic layer is provided on both surfaces of each of the insulating films.

8. A method for manufacturing a nonvolatile semiconductor memory device, comprising:
forming a stacked body on a substrate by alternately stacking semiconductor layers doped with an impurity and semiconductor layers not doped with the impurity and forming one of hydrophobic layers between one of the semiconductor layers doped with the impurity and one of the semiconductor layers not doped with the impurity, the hydrophobic layers having higher hydrophobicity than the semiconductor layers doped with the impurity;
forming through holes extending in a stacking direction of the stacked body so as to pierce the stacked body;
burying a sacrificial material in the through holes;
forming, between the through holes in the stacked body, a slit extending in one direction parallel to an upper surface of the substrate to divide each of the semiconductor layer doped with the impurity into a plurality of portions extending in the one direction;
removing the semiconductor layers not doped with the impurity by introducing an aqueous etching solution into the slit;
removing the aqueous etching solution from between the semiconductor layers doped with the impurity;
burying an insulating material between the semiconductor layers doped with the impurity and in the slit to form an insulating film between the semiconductor layers doped with the impurity and to form an insulating plate in the slit;
removing the sacrificial material from inside the through holes;
forming a charge storage film on an inner surface of each of the through holes; and
forming semiconductor pillars extending in the stacking direction by burying a semiconductor material in the through holes.

9. The method according to claim 8, wherein
the semiconductor layers are formed from silicon,
the impurity is boron,
the hydrophobic layers are formed from silicon nitride, and
the insulating material is silicon oxide.

10. The method according to claim 9, wherein the forming the stacked body includes:
forming one of the semiconductor layers doped with the impurity by depositing silicon doped with boron;
forming a first one of the hydrophobic layers on an upper surface of the one of the semiconductor layers doped with the impurity by performing nitridation treatment;
forming one of the semiconductor layers not doped with the impurity by depositing non-doped silicon; and
forming a second one of the hydrophobic layers on an upper surface of the one of the semiconductor layers not doped with the impurity by performing nitridation treatment.

11. The method according to claim 10, wherein the nitridation treatment is performed by heating in a nitrogen atmosphere.

12. The method according to claim 8, wherein an alkaline aqueous etching solution is used as the aqueous etching solution.

13. The method according to claim 8, wherein the removal of the aqueous etching solution is performed by drying the stacked body.

14. The method according to claim 8, wherein the through holes are collectively formed by dry etching.

15. A method for manufacturing a nonvolatile semiconductor memory device, comprising:
forming a stacked body on a substrate by alternately stacking semiconductor layers doped with an impurity and semiconductor layers not doped with the impurity and forming one of hydrophobic layers between one of the semiconductor layers doped with the impurity and one of the semiconductor layers not doped with the impurity, the hydrophobic layers having higher hydrophobicity than the semiconductor layers doped with the impurity;
forming, in the stacked body, slits extending in one direction parallel to an upper surface of the substrate to divide each of the semiconductor layer doped with the impurity into a plurality of portions extending in the one direction;
burying an insulating material in the slits to form an insulating plates;
forming, between the slits in the stacked body, a through hole extending in stacking direction of the stacked body so as to pierce the stacked body;

removing the semiconductor layers not doped with the impurity by introducing an aqueous etching solution into the through hole;

removing the aqueous etching solution from between the semiconductor layers doped with the impurity;

forming a block insulating film on an upper and lower surface of each of the portions into which the semiconductor layers doped with the impurity is divided, and on an inner surface of the through hole;

forming a charge storage film on the block insulating film;

forming a tunnel insulating film on the charge storage film; and forming a semiconductor pillar extending in the stacking direction by burying a semiconductor material in the through hole.

16. The method according to claim 15, wherein
the semiconductor layers are formed from silicon,
the impurity is boron,
the hydrophobic layers are formed from silicon nitride, and
the insulating material is silicon oxide.

17. The method according to claim 16, wherein the forming a stacked body includes:

forming one of the semiconductor layers doped with the impurity by depositing silicon doped with boron;

forming a first one of the hydrophobic layers on an upper surface of the one of the semiconductor layers doped with the impurity by performing nitridation treatment;

forming one of the semiconductor layers not doped with the impurity by depositing non-doped silicon; and forming a second one of the hydrophobic layers on an upper surface of the one of the semiconductor layers not doped with the impurity by performing nitridation treatment.

18. The method according to claim 17, wherein the nitridation treatment is performed by heating in a nitrogen atmosphere.

19. The method according to claim 15, wherein an alkaline aqueous etching solution is used as the aqueous etching solution.

20. The method according to claim 15, wherein the removal of the aqueous etching solution is performed by drying the stacked body.

21. The method according to claim 15, wherein the through hole is collectively formed by dry etching.

* * * * *